(12) United States Patent
Su et al.

(10) Patent No.: US 10,002,796 B1
(45) Date of Patent: Jun. 19, 2018

(54) DUAL EPITAXIAL GROWTH PROCESS FOR SEMICONDUCTOR DEVICE

(71) Applicant: Taiwan Semiconductor Manufacturing Co., Ltd., Hsinchu (TW)

(72) Inventors: Huan-Chieh Su, Changhua County (TW); Chih-Hao Wang, Hsinchu County (TW); Jui-Chien Huang, Hsinchu County (TW); Chun-Hsiung Lin, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/476,068

(22) Filed: Mar. 31, 2017

Related U.S. Application Data

(60) Provisional application No. 62/434,903, filed on Dec. 15, 2016.

(51) Int. Cl.
*H01L 21/8238* (2006.01)
*H01L 21/02* (2006.01)
(Continued)

(52) U.S. Cl.
CPC .. *H01L 21/823814* (2013.01); *H01L 21/0273* (2013.01); *H01L 21/02532* (2013.01);
(Continued)

(58) Field of Classification Search
CPC ....... H01L 21/823814; H01L 21/02532; H01L 21/02573; H01L 21/02639; H01L 21/0273; H01L 21/0335; H01L 21/0337; H01L 21/31111; H01L 21/31116; H01L 21/823807; H01L 21/823821; H01L 21/823878; H01L 21/28562; H01L 21/76278; H01L 51/0011; H01L 21/02636; H01L 21/76262; H01L 21/76294; H01L 21/201
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |

(Continued)

*Primary Examiner* — Yasser A Abdelaziez
(74) *Attorney, Agent, or Firm* — Sterne, Kessler, Goldstein & Fox P.L.L.C.

(57) ABSTRACT

A method of forming a semiconductor device includes forming first and second fin structures on a substrate and a patterned polysilicon structure on first portions of the first and second fin structures. The method further includes depositing an insulating layer on second portions of the first and second fin structures and on the patterned polysilicon structure, which may be followed by selectively removing the insulating layer from the second portions and patterning a first hard mask layer on the second portion of the second fin structure. The method also includes growing a first epitaxial region on the second portion of the first fin structure, removing the patterned first hard mask layer from the second portion of the second fin structure, patterning a second hard mask layer on the first epitaxial region, and growing a second epitaxial region on the second portion of the second fin structure.

20 Claims, 16 Drawing Sheets

(51) Int. Cl.
*H01L 21/033* (2006.01)
*H01L 21/027* (2006.01)
*H01L 21/311* (2006.01)

(52) U.S. Cl.
CPC .. *H01L 21/02573* (2013.01); *H01L 21/02639* (2013.01); *H01L 21/0335* (2013.01); *H01L 21/0337* (2013.01); *H01L 21/31111* (2013.01); *H01L 21/31116* (2013.01); *H01L 21/823807* (2013.01); *H01L 21/823821* (2013.01); *H01L 21/823878* (2013.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0187235 A1* | 7/2013 | Huang ............ H01L 21/823821 257/369 |
| 2016/0329253 A1* | 11/2016 | Liu ................ H01L 21/823821 |
| 2017/0069630 A1* | 3/2017 | Cha ................... H01L 27/0924 |
| 2017/0229350 A1* | 8/2017 | Bergendahl ..... H01L 21/823814 |

* cited by examiner

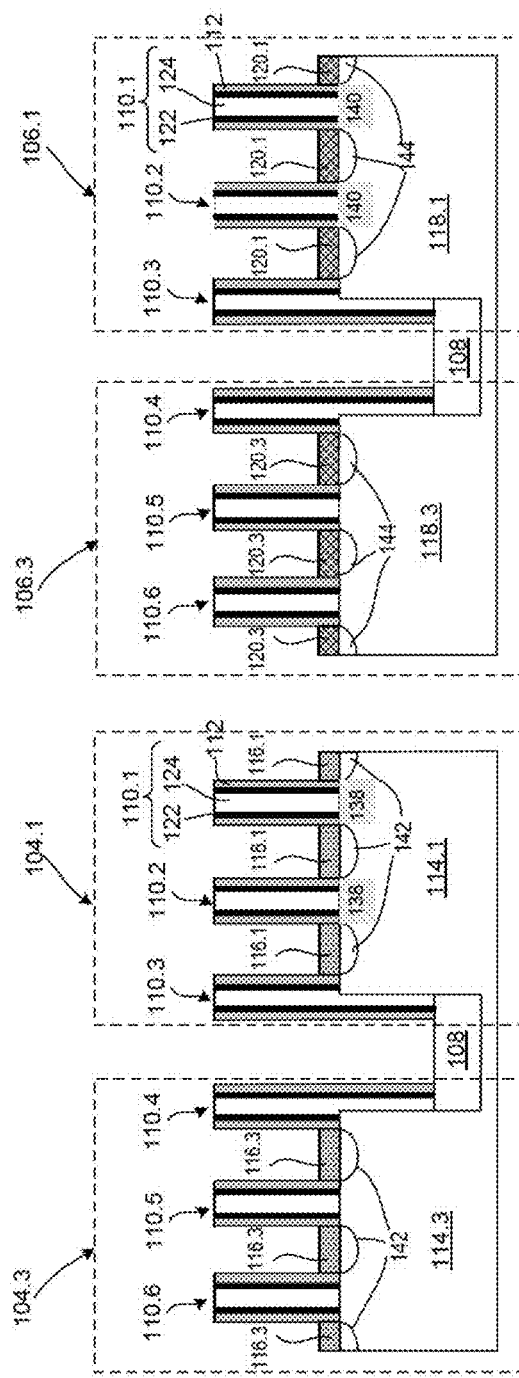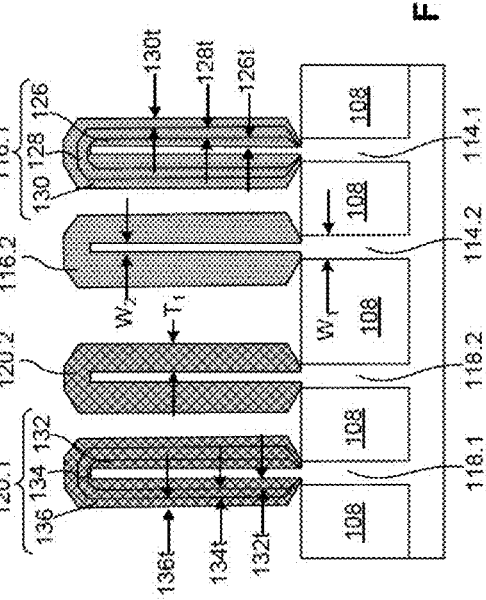
FIG. 1C  FIG. 1D  FIG. 1E

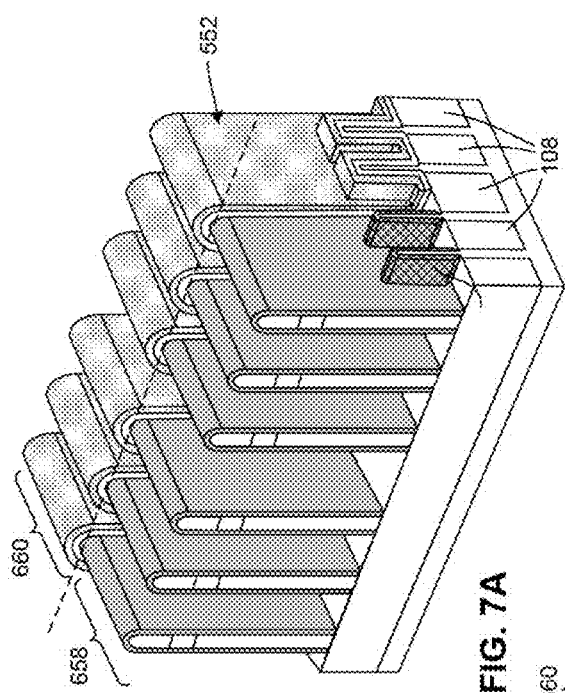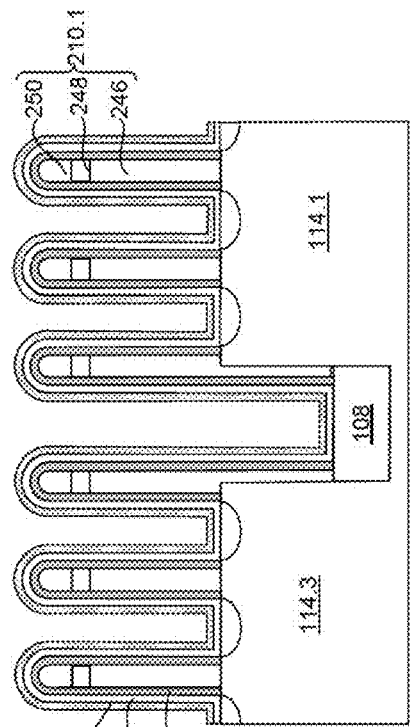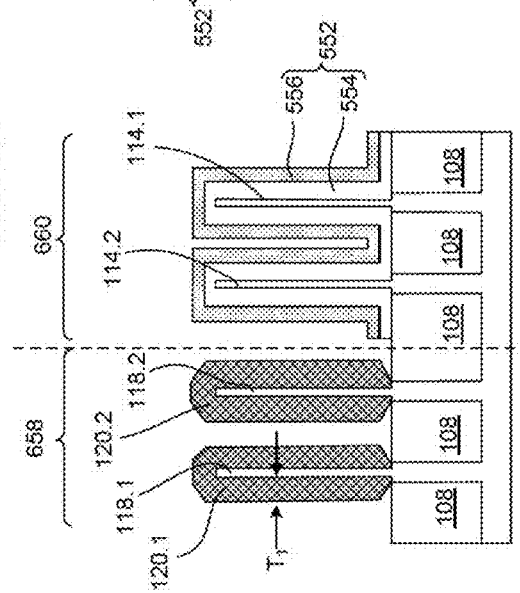

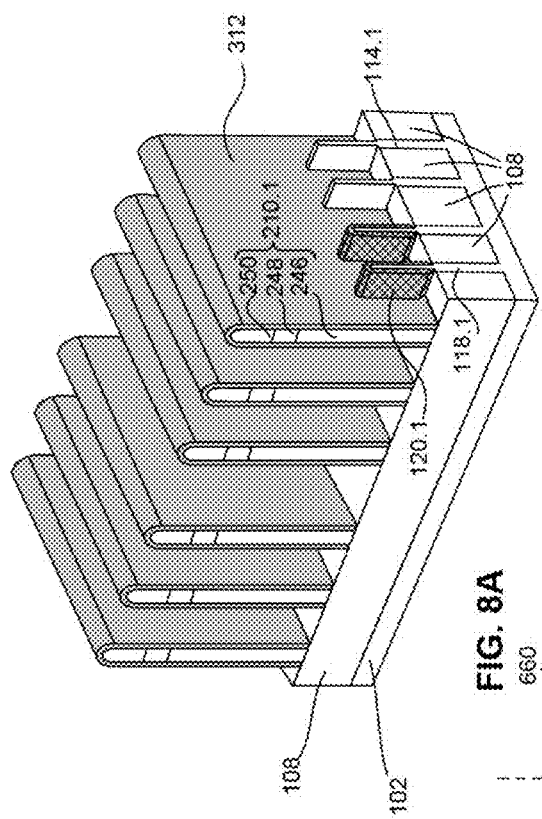
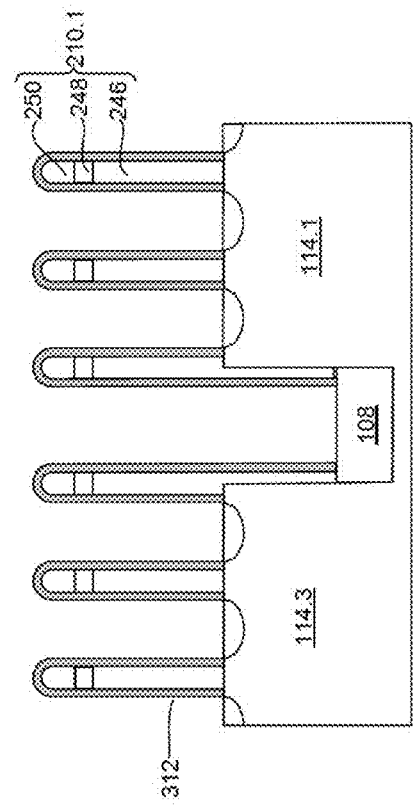
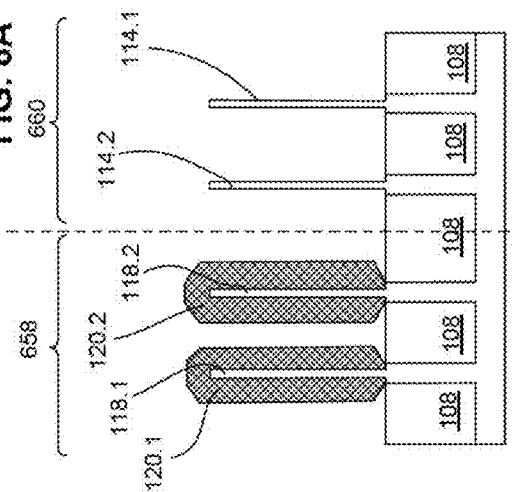
FIG. 8A
FIG. 8B
FIG. 8C

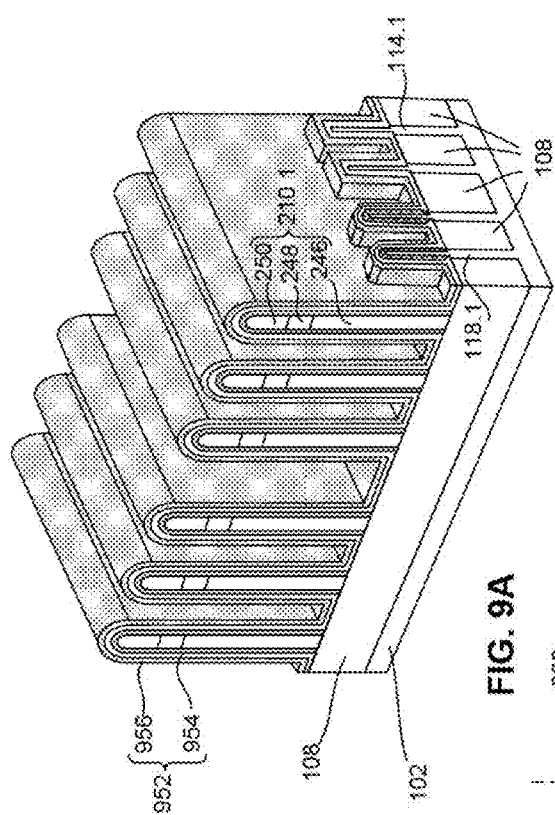
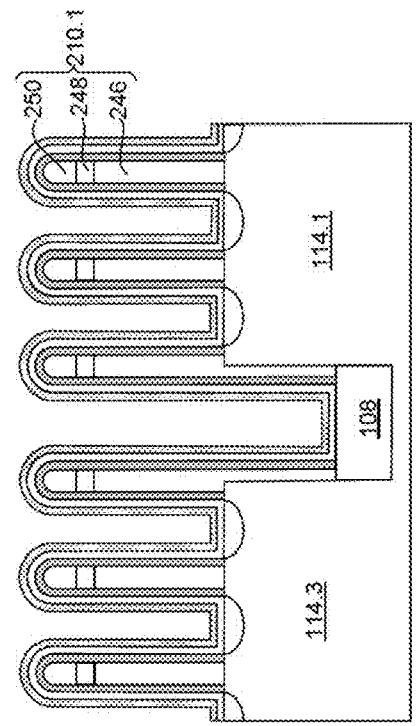
FIG. 9A
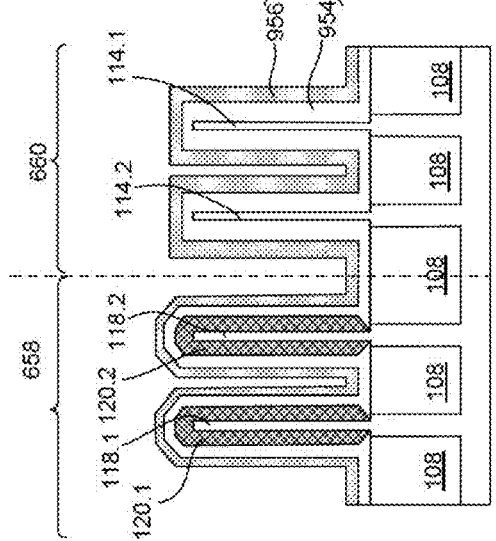
FIG. 9B
FIG. 9C

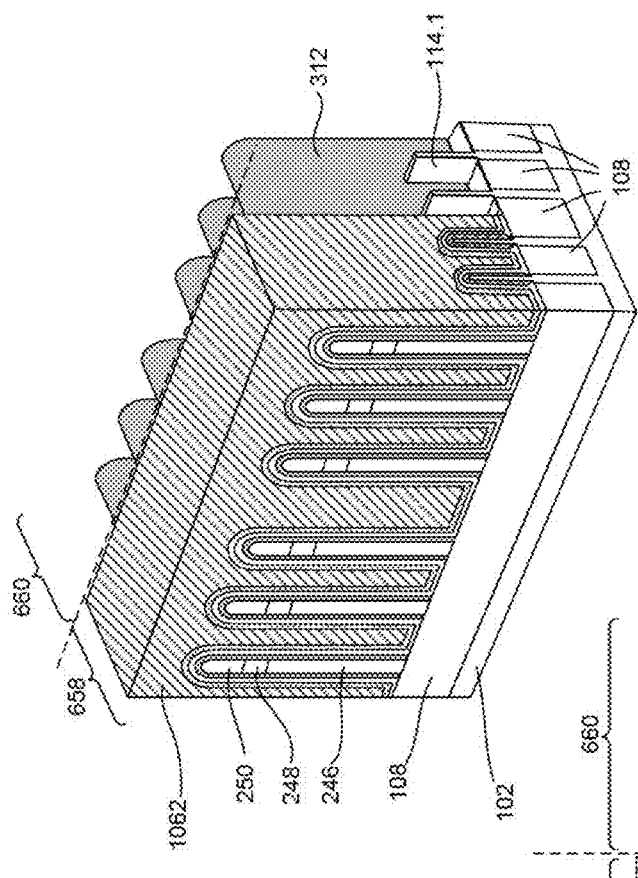
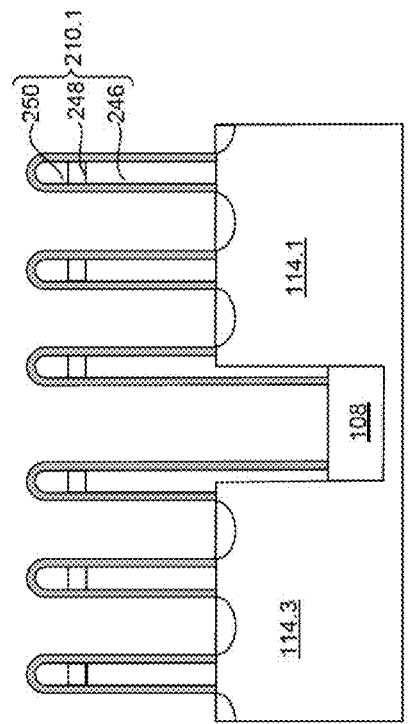
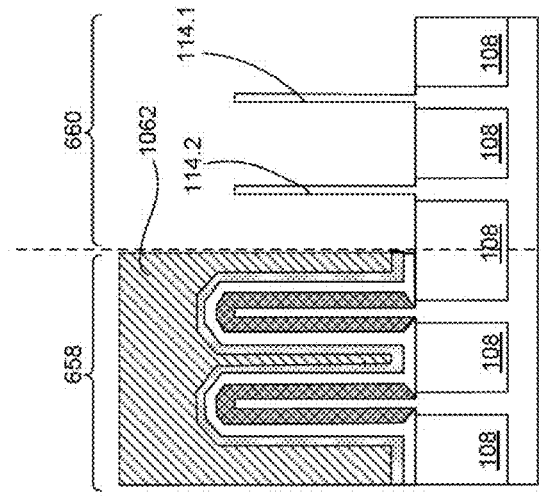
FIG. 10A
FIG. 10B
FIG. 10C

DUAL EPITAXIAL GROWTH PROCESS FOR SEMICONDUCTOR DEVICE

CROSS REFERENCE TO RELATED APPLICATIONS

This application is related to U.S. Provisional Patent Application No. 62/434,903, filed Dec. 15, 2016, which is hereby incorporated by reference in its entirety.

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs. Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1C-1E are cross-sectional views of semiconductor device of FIG. 1A along lines A-A, B-B, and C-C, respectively, in accordance with some embodiments.

FIGS. 2A-12A are isometric views of a semiconductor device at various stages of its fabrication process, in accordance with some embodiments.

FIGS. 2B-12B and 2C-12C are cross-sectional views of a semiconductor device at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
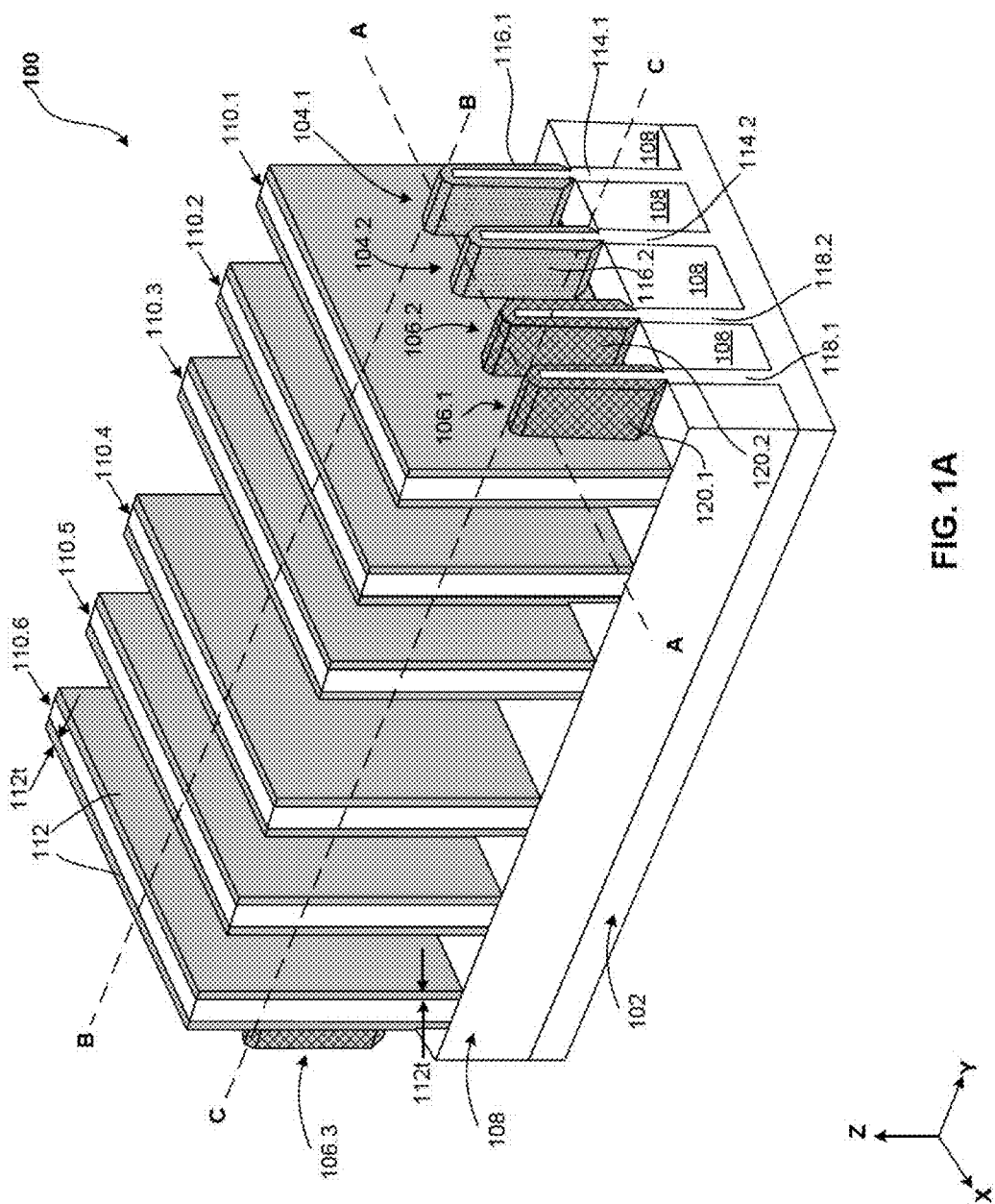
FIGS. 1A-1B are isometric views of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

The term "about" as used herein indicates the value of a given quantity varies by ±10% of the value, unless noted otherwise.

As used herein, the term "substrate" describes a material onto which subsequent material layers are added. The substrate itself may be patterned. Materials added on top of the substrate may be patterned or may remain unpatterned. Furthermore, the substrate may be any of a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is smaller than the dielectric constant of $SiO_2$ (e.g., smaller than 3.9).

As used herein, the term "p-type" defines any structure, layer, and/or region as being doped with p-type dopants, such as, for example, boron.

As used herein, the term "n-type" defines any structure, layer, and/or region as being doped with n-type dopants, such as, for example, phosphorus.

Overview

This disclosure provides example methods for fabricating n-type finFETs (NFETs) and p-type finFETs (PFETs) of a semiconductor device using a dual epitaxial growth process. These methods provide a highly selective and conformal growth of n-type and p-type epitaxial regions on fin structures of NFETs and PFETs, respectively, compared to other methods of forming epitaxial regions on fin structures of NFETs and PFETs. Such highly selective growth of epitaxial regions is achieved with substantially reduced or minimal damage to structural and functional integrity of fin structures of NFETs and PFETs compared to other NFETs and PFETs of semiconductor devices.

An Embodiment of a Device Having N-type and P-type FinFETs

Figure 1B:
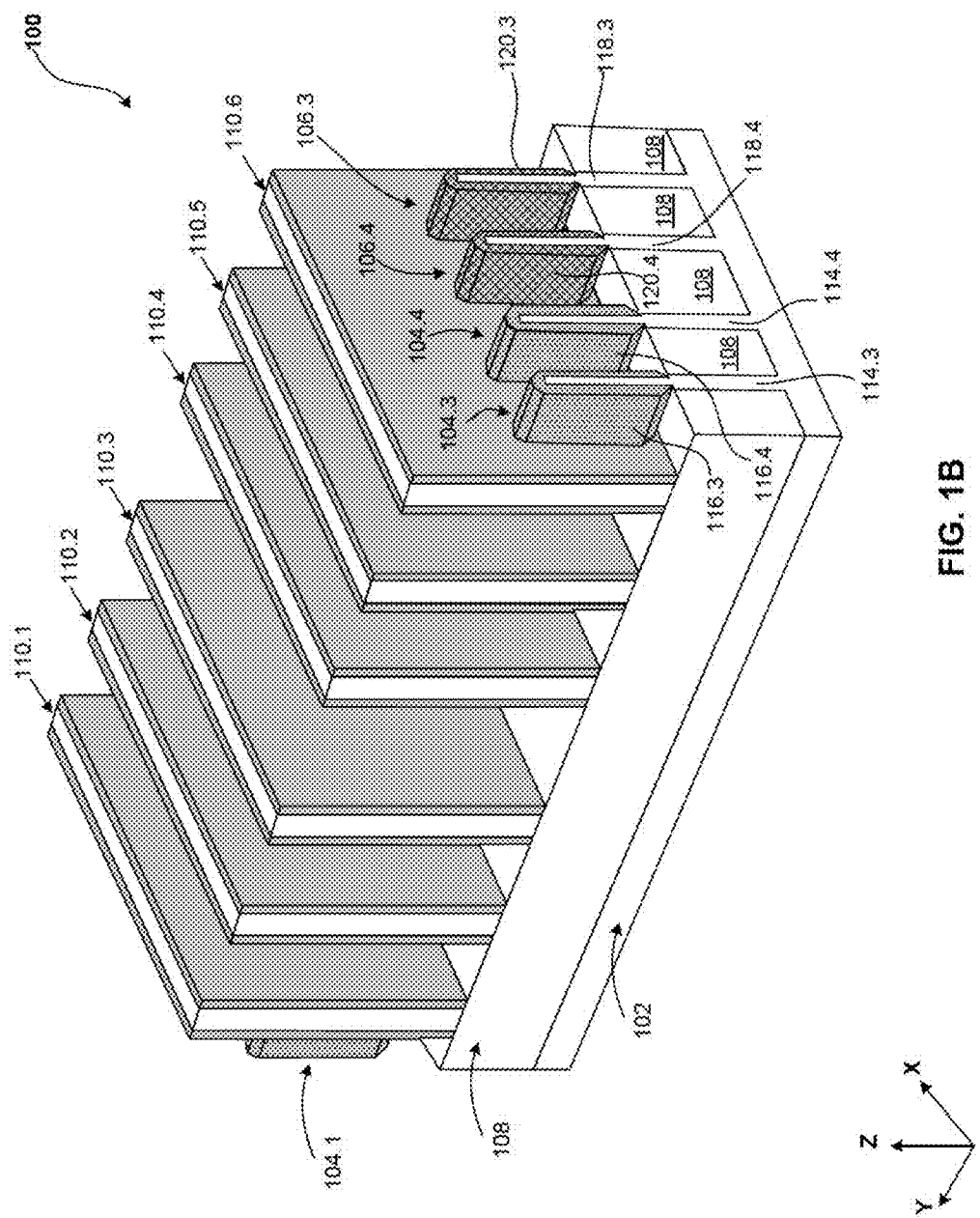

FIGS. 1A-1B are isometric views of a device 100 after a gate replacement process, according to some embodiments. FIG. 1B is a 180 degrees rotated (e.g., along a Z-axis) view of device 100 with respect to FIG. 1A. FIGS. 1C-1E are cross-sectional views along lines A-A, B-B, and C-C of FIG. 1A, respectively, according to some embodiments. Device 100 may be included in a microprocessor, memory cell, or other integrated circuit (IC). A person of ordinary skill in the art will recognize that views of device 100 in FIGS. 1A-1E are shown for illustration purposes and may not be drawn to scale.

Device 100 is discussed in this section with reference to FIGS. 1A-1E. Device 100 may be formed on a substrate 102 and may include p-type finFETs (PFETs) 104.1 through 104.4 and n-type finFETs (NFETs) 106.1 through 106.4 as shown in FIGS. 1A and 1B. Device 100 may further include shallow trench isolation (STI) regions 108, gate structures 110.1 through 110.6, and spacers 112 disposed on opposite sides of each of gate structures 110.1 through 110.6.

Substrate 102 may be physical material on which PFETs 104.1 through 104.4 and NFETs 106.1 through 106.4 are formed. Substrate 102 may be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 may be doped depending on design requirements (e.g., p-type substrate or n-type substrate). In some embodiments, substrate 102 may be doped with p-type dopants (e.g., boron, indium, aluminum, or gallium) or n-type dopants (e.g., phosphorus or arsenic).

STI regions 108 may provide electrical isolation to PFETs 104.1 through 104.4 and NFETs 106.1 through 106.4 from each other and from neighboring active and passive elements (not illustrated herein) integrated with or deposited onto substrate 102. STI regions 108 may be made of a dielectric material. In some embodiments, STI regions 108 may include silicon oxide, silicon nitride, silicon oxynitride, fluorine-doped silicate glass (FSG), a low-k dielectric material, and/or other suitable insulating material. In some embodiments, STI regions 108 may include a multi-layered structure.

In some embodiments, PFETs 104.1 through 104.4 may include fin structures 114.1 through 114.4 and p-type epitaxial regions 116.1 through 116.4, respectively. In some embodiments, NFETs 106.1 through 106.4 may include fin structures 118.1 through 118.4 and n-type epitaxial regions 120.1 through 120.4, respectively.

Fin structures 114.1, 114.2, 118.1, and 118.2 may traverse along a Y-axis and through gate structures 110.1, 110.2, and 110.3. Fin structures 114.3, 114.4, 118.3, and 118.4 may also traverse along the Y-axis and through gate structures 110.4, 110.5, and 110.6. Portions of fin structures 114.1, 114.2, 118.1, and 118.2 extending above STI regions 108 may be wrapped around by each of gate structures 110.1 through 110.3. Similarly, portions of fin structures 114.3, 114.4, 118.3, and 118.4 extending above STI regions 108 may be wrapped around by each of gate structures 110.4 through 110.6.

In some embodiments, fin structures 114.1 through 114.4 and 118.1 through 118.4 may include material similar to substrate 102. In some embodiments, fin structures 114.1 through 114.4 and 118.1 through 118.4 may be formed from a photolithographic patterning and an etching of substrate 102. Portions of each of fin structures 114.1 through 114.4 and 118.1 through 118.4 within STI regions 108 may have a width $W_1$ (shown in FIG. 1E) in a range from about 5 nm to about 10 nm, according to some embodiments. Portions of each of fin structures 114.1 through 114.4 and 118.1 through 118.4 extending above STI regions 108 may have a width $W_2$ (e.g., as shown in FIG. 1E) in a range from about 3 nm to about 6 nm, according to some embodiments. Based on the disclosure herein, a person of ordinary skill in the art will recognize that other widths and materials for fin structures 114.1 through 114.4 and 118.1 through 118.4 are within the scope and spirit of this disclosure.

In some embodiments, p-type epitaxial regions 116.1 through 116.4 may be grown on portions of fin structures 114.1 through 114.4, respectively, that extends above STI regions 108 and are not underlying gate structures 110.1 through 110.6, as illustrated in FIGS. 1A-1D. Similarly, FIGS. 1A-1D illustrate n-type epitaxial regions 120.1 through 120.4 grown on portions of fin structures 118.1 through 118.4, respectively, that extends above STI regions 108 and are not underlying gate structures 110.1 through 110.6, according to some embodiments.

Epitaxial regions 116.1 through 116.4 and 120.1 through 120.3 may include an epitaxially-grown semiconductor material. In some embodiments, the epitaxially grown semiconductor material is the same material as the material of substrate 102. In some embodiments, the epitaxially-grown semiconductor material includes a different material from the material of substrate 102. The epitaxially-grown semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. In some embodiments, each of epitaxial regions 116.1 through 116.4 and 120.1 through 120.3 may have a thickness $T_1$ (e.g., as shown in FIG. 1E) in a range from about 5 nm to about 15 nm around portions of fin structures above STI regions 108.

In some embodiments, epitaxial regions 116.1 through 116.4 and 120.1 through 120.3 may be grown by (i) CVD such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial regions 116.1 through 116.4 and 120.1 through 120.3 may be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial regions 116.1 through 116.4 and 120.1 through 120.3 may be grown by selective epitaxial growth (SEG), where an etching gas is added to promote the selective growth of semiconductor material on the exposed surfaces of fin structures, but not on insulating material (e.g., dielectric material of STI regions 108).

P-type epitaxial regions 116.1 through 116.4 may include SiGe and may be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. N-type epitaxial regions 120.1 through 120.4 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used.

In some embodiments, each of p-type epitaxial regions 116.1 through 116.4 may have sub-regions that may include SiGe and may differ from each other based on, for example, doping concentration, epitaxial growth process conditions, and/or relative concentration of Ge with respect to Si.

For example, as shown in FIG. 1E, epitaxial region 116.1 may have p-type sub-regions 126, 128, and 130, where sub-regions 126, 128, and 130 are epitaxially grown on fin structure 116.1, sub-region 126, and sub-region 128, respectively. In some embodiments, sub-regions 126, 128, and 130 may have thicknesses 126t, 128t, 130t in a range from about 0.5 nm to about 5 nm, from about 2 nm to about 5 nm, and from about 0.5 nm to about 5 nm, respectively. In some embodiments, the atomic percent Ge in sub-region 126 may be smaller than the atomic percent Ge in sub-regions 128 and 130.1. In some embodiments, the atomic percent Ge in sub-region 126 is equal to or approximately equal to the atomic percent Ge in sub-region 130, but smaller than the atomic percent Ge in sub-region 128. In some embodiments, sub-region 126 includes Ge in a range from about 15 atomic percent to about 35 atomic percent, while sub-region 128 includes Ge in a range from about 40 atomic percent to about 70 atomic percent, and sub-region 130 includes Ge in a range from about 25 atomic percent to about 50 atomic percent with any remaining atomic percent being Si in sub-regions 126, 128, and 130.

Sub-regions 126, 128, and 130 may be epitaxially grown under a pressure of about 10 Torr to about 300 Torr and at a temperature of about 500° C. to about 700° C. using reaction gases such as HCl as an etching agent, $GeH_4$ as Ge precursor, dichlorosilane (DCS) and/or $SiH_4$ as Si precursor, $B_2H_6$ as B dopant precursor, $H_2$, and/or $N_2$. To achieve different concentration of Ge in sub-regions 126, 128, and 130, the ratio of a flow rate of Ge to Si precursors may be varied during their respective growth process, according to some embodiments. For example, a Ge to Si precursor flow rate ratio in a range from about 9 to about 25 may be used during the epitaxial growth of sub-region 128, while a Ge to Si precursor flow rate ratio less than about 6 may be used during the epitaxial growth of sub-region 130.

Sub-regions 126, 128, and 130 may have varying p-type dopant concentration with respect to each other, according to some embodiments. For example, sub-region 126 may be undoped or may have a dopant concentration lower than the dopant concentrations of sub-regions 128 and 130. In some embodiments, sub-region 126 may have a dopant concentration less than about $8 \times 10^{20}$ atoms/$cm^3$, while sub-region 128 may have a dopant concentration in a range from about $1 \times 10^{20}$ to about $3 \times 10^{21}$ atoms/$cm^3$, and sub-region 130 may have a dopant concentration in a range from about $1 \times 10^{20}$ to about $3 \times 10^{22}$ atoms/$cm^3$. Epitaxial regions 116.2 through 116.4 may have sub-regions (not shown) similar to sub-regions 126, 128, and 130.

Further illustrated in FIG. 1E, epitaxial region 120.1 may have n-type sub-regions 132, 134, and 136, where sub-regions 132, 134, and 136 are epitaxially grown on fin structure 120.1, sub-region 132, and sub-region 134, respectively. Except for the type of dopants, sub-regions 132, 134, and 136 may similar to sub-region 126 128, and 130, respectively, in thickness, relative Ge concentration with respect to Si, dopant concentration, and/or epitaxial growth process conditions. Epitaxial regions 120.2 through 120.4 may have sub-regions (not shown) similar to sub-regions 132, 134, and 136.

Based on the disclosure herein, a person of ordinary skill in the art will recognize that other materials, thicknesses, Ge concentrations, and dopant concentrations for sub-regions 126, 128, 130, 132, 134, and 136 are within the scope and spirit of this disclosure.

Fin structures 114.1 through 114.4 and 118.1 through 118.4 are current-carrying structures for PFETs 104.1 through 104.4 and NFETs 106.1 through 106.4, respectively. Epitaxial regions 116.1 through 116.4 along with the portions of fin structures 114.1 through 114.4 covered by respective epitaxial regions 116.1 through 116.4 are configured to function as source/drain (S/D) regions of PFETs 104.1 through 104.4, respectively. Similarly, epitaxial regions 120.1 through 120.4 along with the portions of fin structures 118.1 through 118.4 covered by respective epitaxial regions 120.1 through 120.4 are configured to function as source/drain (S/D) regions of NFETs 106.1 through 106.4, respectively. Channel regions of PFETs and NFETs may be formed in portions of their respective fin structures underlying gate structures. For example, channel regions 138 in PFET 104.1 may be formed in portions of fin structure 114.1 underlying gate structures 110.1 through 110.3, as shown in FIG. 1C. Example channel regions 140 in NFET 106.1 is shown in FIG. 1D. Channel regions 140 may be formed in portions of fin structure 118.1 underlying gate structures 110.1 through 110.3.

Gate structure 110.1 is further discussed below with reference to FIGS. 1C and 1D. However, as gate structures 110.1 through 110.6 may be similar in structure, composition, and function with respect to each other, it should be understood that discussion of gate structure 110.1 applies to gate structures 110.2 through 110.6 unless mentioned otherwise.

As shown in FIGS. 1C and 1D, gate structure 110.1 may include a dielectric layer 122 and a gate electrode 124. Dielectric layer 122 and gate electrode 124 are not shown in FIGS. 1A and 1B for the sake of simplicity. In some embodiments, dielectric layer 122 is adjacent to and in contact with gate electrode 124. In some embodiments, a thickness of dielectric layer 122 may be in a range of about 1 nm to about 5 nm. Gate structure 110.1 may further include capping layers, etch stop layers, and/or other suitable materials, in some embodiments. Gate structure 110.1 may be formed by a gate replacement process.

Dielectric layer 122 may include silicon oxide and may be formed by CVD, ALD, physical vapor deposition (PVD), e-beam evaporation, or other suitable process. In some embodiments, dielectric layer 122 may include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers may be formed by ALD and/or other suitable methods. In some embodiments, dielectric layer 122 may include a single layer or a stack of insulating material layers. Spacers 112 may be in contact with dielectric layer 122.

Gate electrode 124 may include a gate work function metal layer and a gate metal fill layer (not shown). In some embodiments, gate work function metal layer may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, the gate metal fill layer may include a suitable conductive material, such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. The gate metal fill layer and gate work function metal layer may be formed by ALD, PVD, CVD, or other suitable deposition process.

Referring back to FIG. 1A, spacers 112 may include insulating material such as, for example, silicon oxide, silicon nitride, a low-k material, or a combination thereof. Spacers 112 may have a low-k material with a dielectric constant smaller than 3.9 (e.g., smaller than 3.5, 3, or 2.8). In some embodiments, each of spacers 112 may have a thickness 112t in a range from about 7 nm to about 10 nm. Based on the disclosure herein, a person of ordinary skill in the art will recognize that other thicknesses for spacers 112 are within the scope and spirit of this disclosure.

Additionally or optionally, each of PFETs 104.1 through 104.4 and each of NFETs 106.1 through 106.4 have lightly-doped-drain (LDD) regions. For the sake of simplicity and clarity, LDD regions are not shown in FIGS. 1A, 1B, and 1E. For ease of discussion, p-type LDD regions 142 of PFETs 104.1 and 104.3 are shown in FIG. 1C and n-type LDD regions 144 of NFETs 106.1 and 106.3 are shown in FIG. 1D. P-type LDD regions 142 may be formed in portions of fin structures 114.1 and 114.3 underlying p-type epitaxial regions 116.1 and 116.3, respectively. N-type LDD regions 144 may be formed in portions of fin structures 118.1 and 118.3 underlying n-type epitaxial regions 120.1 and 120.3, respectively. LDD regions 142 and 144 may have a p-type and n-type dopant concentration in a range from about $1\times10^{13}$ atoms/cm$^3$ to about $1\times10^{14}$ atoms/cm$^3$.

Although device 100 is shown in FIGS. 1A-1B as having four PFETs 104.1 through 104.4 and four NFETs 106.1 through 106.4, device 100 may include any suitable number of PFETs and NFETs as would be understood by a person of ordinary skill in the art. Based on the disclosure herein, a person of ordinary skill in the art will recognize that cross-sectional shapes of STI regions 108, spacers 112, fin structures 114.1 through 114.4 and 118.1 through 118.4, and epitaxial regions 116.1 through 116.4 and 120.1 and 120.4 are illustrative and are not intended to be limiting.

An Example Method for Fabricating a Device Using a Dual Epitaxial Process

FIGS. 2A-12A are isometric views of device 100 (as illustrated in FIGS. 1A-1E) at various stages of its fabrication, according to some embodiments. FIGS. 2B-12B and 2C-12C are cross-sectional views along lines A-A and B-B of device 100 of FIG. 1 at various stages of its fabrication, according to some embodiments. For sake of simplicity and clarity, the example method for fabricating p-type finFET (PFET) 104.1 and n-type finFET (NFET) 106.1 of device 100 is discussed below with reference to FIGS. 2A-12A, 2B-12B, and 2C-12C. As PFETs 104.1 through 104.4 are similar to each other and formed simultaneously and NFETs 106.1 and 106.4 are similar to each other and formed simultaneously, a person of ordinary skill in the art would be understood that the discussion of PFET 104.1 applies to PFETs 104.2 through 104.4 and the discussion of NFET 106.1 applies to NFETs 106.2 through 106.4 unless mentioned otherwise.

Figure 2A:
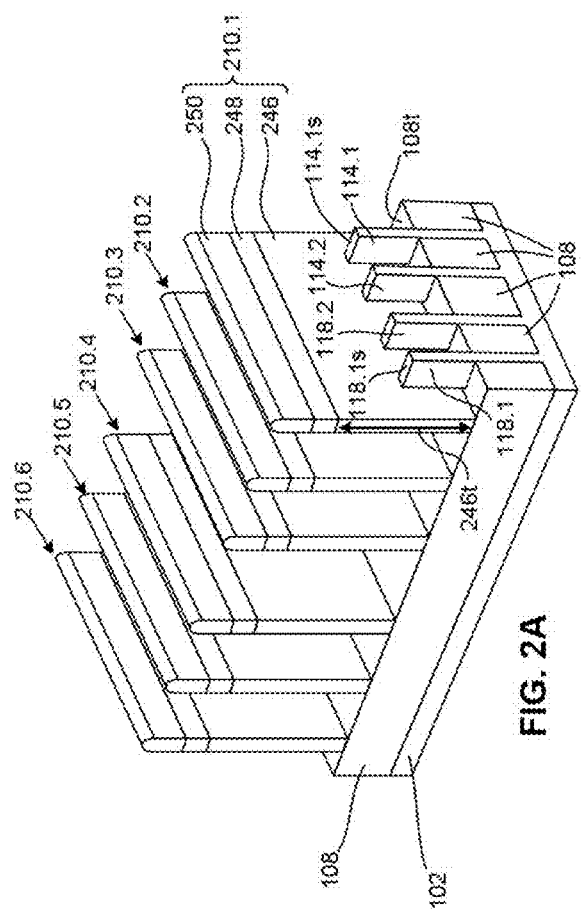
Figure 2C:
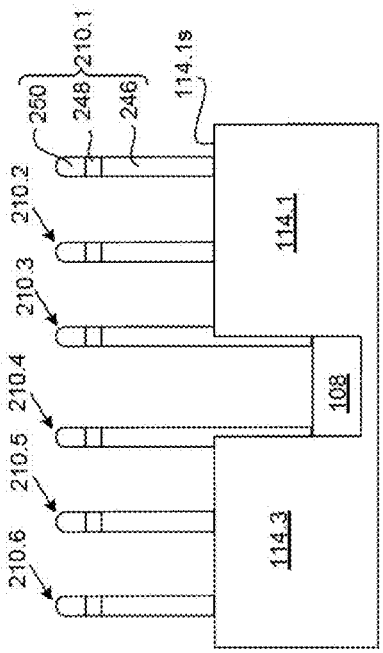
Figure 2B:
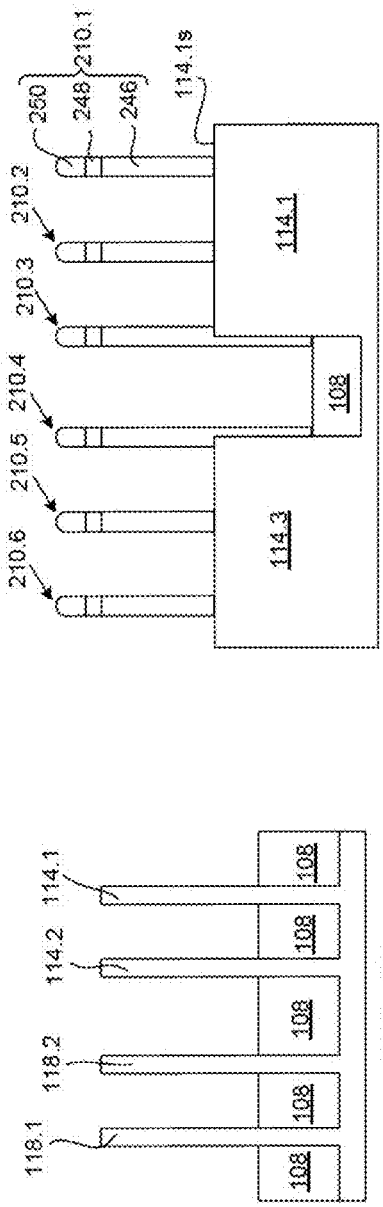

FIGS. 2A-2C are views of a partially fabricated device 100 after formation of fin structures 114.1 and 118.1, shallow trench isolation (STI) regions 108, and structures 210.1 through 210.6, according to some embodiments. Fin structures 114.1 and 118.1 are formed by photolithographic patterning and etching of substrate 102. Formation of STI regions 108 may involve blanket deposition of a dielectric material on fin structures 114 and 118.1 and substrate 102 prior to formation of structures 210.1 through 210.6. The blanket deposition may be followed by etching of the deposited dielectric material to form STI regions 108 as shown in FIGS. 2A-2C. In some embodiments, the dielectric material may include, for example, silicon oxide, silicon nitride, silicon oxynitride, fluoride-doped silicate glass (FSG), or a low-k dielectric material. In some embodiments, the dielectric material may be formed using a flowable chemical vapor deposition (FCVD) process, a high-density-plasma (HDP) CVD process, using silane ($SiH_4$) and oxygen ($O_2$) as reacting precursors. In some embodiments, the dielectric material may be formed using a sub-atmospheric CVD (SACVD) process or high aspect-ratio process (HARP), where process gases may include tetraethoxysilane (TEOS) and/or ozone ($O_3$). In some embodiments, the dielectric material may be formed using a spin-on-dielectric (SOD) such as, for example, hydrogen silsesquioxane (HSQ) or methyl silsesquioxane (MSQ).

Etching of the dielectric material may be performed using a wet etching process such as, for example, by dipping substrate 102 in hydrofluoric acid (HF). Alternatively, the etching operation may be performed using a dry etching process such as, for example, using $CHF_3$ or $BF_3$ as etching gases. In some embodiments, a vertical dimension of portions of fin structures 114.1 and 118.1 extending above STI regions 108 may be in a range from about 15 nm to about 50 nm, from about 20 nm to about 40 nm, or from about 25 nm to about 35 nm. Based on the disclosure herein, a person of ordinary skill in the art will recognize that other vertical dimension for portions of fin structures 114.1 and 118.1 extending above STI regions 108 are within the scope and spirit of this disclosure.

Each of structures 210.1 through 210.6 may include a patterned polysilicon structure 246 and patterned first and second hard mask layers 248 and 250. Patterned polysilicon structure 246 is formed over top surfaces 108t of STI regions 108 and over top surfaces 114.1s and 118.1s of fin structures 114.1 and 118.1, respectively, to wrap around portions of fin structures 114.1 and 118.1 extending above STI regions 108. In some embodiments, a vertical dimension 246t of patterned polysilicon structure 246 may be in a range from about 90 nm to about 200 nm. Patterned polysilicon structure 246 may be formed by blanket deposition of polysilicon, followed by photolithography and etching of the deposited polysilicon. The deposition process may include CVD, plasma vapor deposition (PVD), atomic layer deposition (ALD), other suitable deposition methods, and/or combinations thereof. Polysilicon etching may include dry etching, wet etching, and/or other etching methods (e.g., reactive ion etching). In some embodiments, structures 210.1 through 210.6 may be replaced in a gate replacement process during subsequent processing of device 100 to form gate structures 110.1 through 110.6, respectively.

Patterned first and second hard mask layers 248 and 250 may include a nitride material and an oxide material, respectively. Both hard mask layers 248 and 250 may be formed by blanket deposition of their respective materials followed by an etch process of the deposited materials. Deposition and etching processes of patterned first and second hard mask layers 248 and 250 may be similar to those for patterned polysilicon structure 246 discussed above. In some embodiments, vertical dimensions of first and second hard mask layers 248 and 250 may be in a range from about 10 nm to about 20 nm and from about 40 nm to about 60 nm, respectively.

Figure 3A:
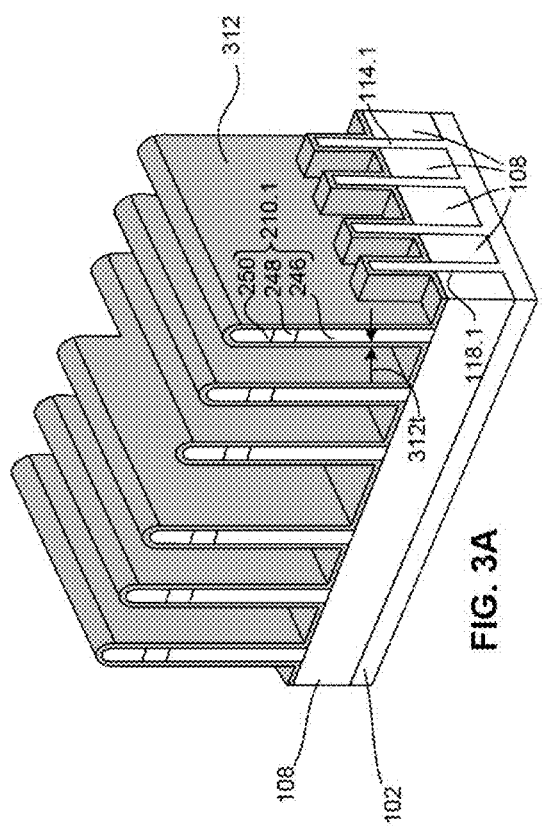
Figure 3C:
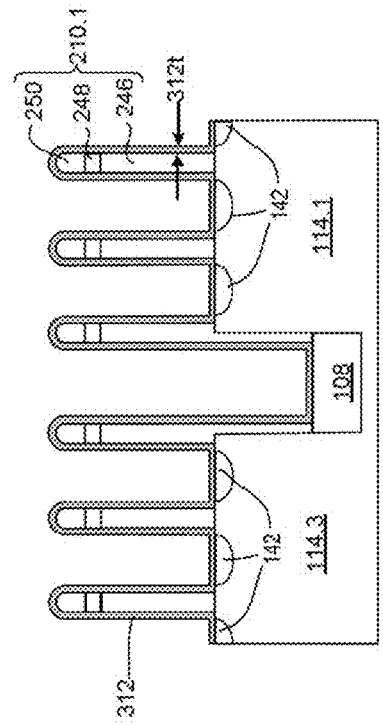
Figure 3B:
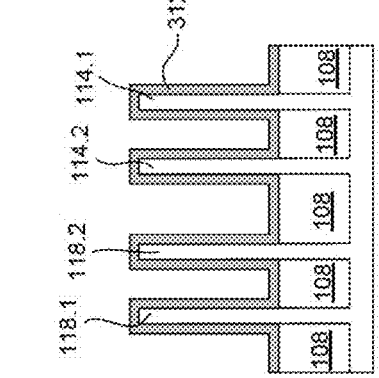

FIGS. 3A-3C are views of a partially fabricated device 100 after formation of spacer material layer 312 and p-type lightly-doped-drain (LDD) regions 142 and n-type LDD regions 144 (not shown in FIGS. 3A-3C; shown above in FIG. 1D), according to some embodiments. Spacer material layer 312 may include (i) a dielectric material such as, for example, silicon oxide, silicon carbide, silicon nitride, silicon oxy-nitride, (ii) any oxide material, (iii) any nitride material, (iv) a low-k material, or (v) a combination thereof. In some embodiments, a thickness 312t of spacer material layer 312 may be in a range from about 7 nm to about 10 nm.

Spacer material layer 312 may be blanket deposited on partially formed device 100 of FIG. 2A in two stages using any suitable deposition process such as, for example, CVD or ALD. In the first stage deposition, a thickness of spacer material layer 312 in a range from about 3 nm to about 5 nm may be deposited. The first stage deposition may be followed by formation of p-type LDD regions 142 and n-type LDD regions 144. LDD regions 142 and 144 may be formed by ion implantation of p-type dopants (e.g., boron) and n-type dopants (e.g., phosphorus), respectively, in portions of fin structures 114.1 and 118.1 that are not covered by structures 210.1 through 210.3. Formation of LDD regions 142 and 144 may be followed by the second stage deposition of spacer material layer 312. During the second stage deposition, a thickness of spacer material layer 312 in a range from about 4 nm to about 6 nm may be deposited to achieve a final thickness 312t. In some embodiments, spacer material layer 312 may be polished by, for example, chemical mechanical polishing during subsequent processing of device 100 to form spacers 112 shown in FIGS. 1A-1D.

Figure 4A:
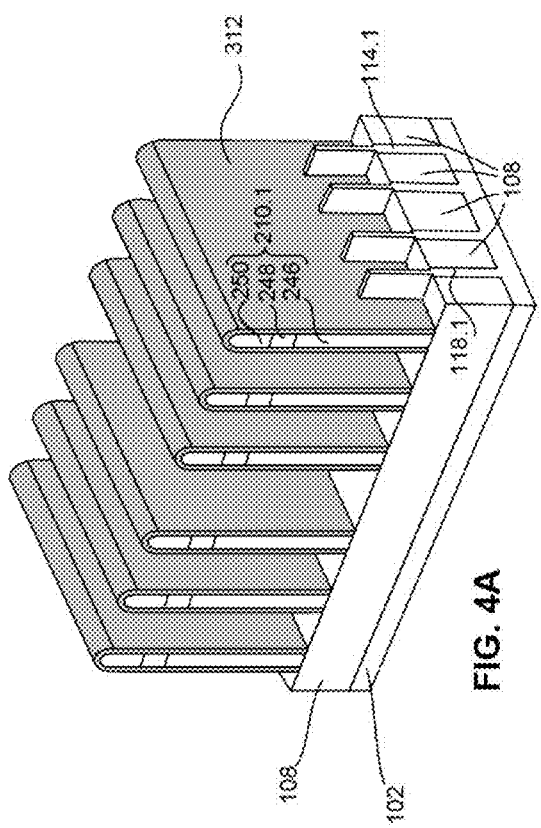
Figure 4C:
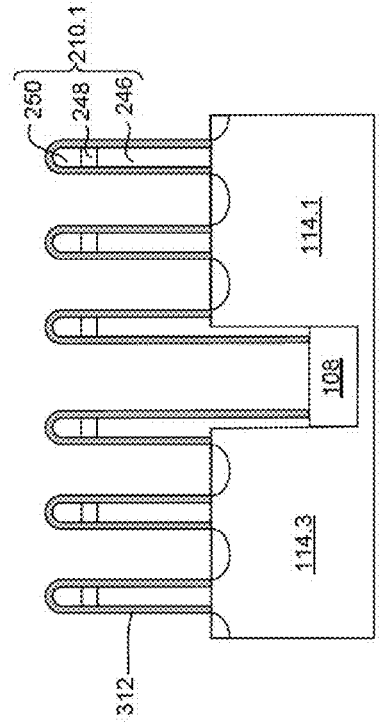
Figure 4B:
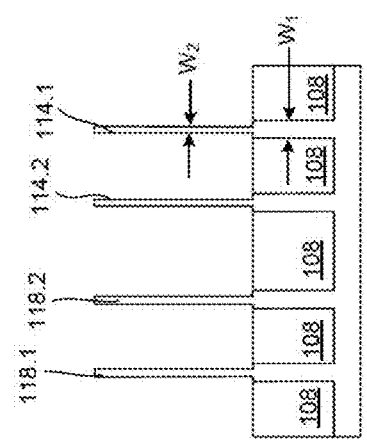

FIGS. 4A-4C are views of a partially fabricated device 100 after etch back of spacer material layer 312 from top surfaces and sidewalls of fin structures 114.1 and 118.1 and fin trimming of portions of fin structures 114.1 and 118.1 extending above STI regions 108, according to some embodiments. The etch back of spacer material layer 312 from fin structures 114.1 and 118.1 may be simultaneously performed. In some embodiments, etch back of spacer layer material 312 may be performed using a dry etching process such as, for example, reactive ion etching (ME) or any other dry etching process using a chlorine or fluorine based etchant. The etchant used may have a selectivity of low-k material to oxide or nitride material greater than about 7:1 such as, for example, about 10:1, about 15:1, or about 20:1.

In some embodiments, etch back of spacer layer material 312 may be performed using a cyclic process of deposition and etching. In this cyclic process, one or more cycles of a carbon based polymer deposition may be followed by a dry etching process using a chlorine or fluorine based etchant as discussed above. A thicker layer of carbon based polymer may be deposited on spacer material layer 312 covered structures 210.1 through 210.6 than on spacer material layer 312 covered fin structures 114.1 and 118.1 due to height difference between structures 210.1 through 210.6 and fin structures 114.1 and 118.1. The carbon based polymer layer may prevent spacer material layer 312 on structures 210.1 through 210.6 from being etched during dry etching cycle, and thus, allow selective etch back of spacer material 312 from top surfaces and sidewalls of fin structures 114.1 and 118.1.

In some embodiments, etch back of spacer material layer 312 may be followed by an etching process to remove the layer of carbon based polymer from spacer material layer 312 covered structures 210.1 through 210.6 using an etchant gas such as, for example, oxygen, nitrogen, and/or hydrogen. Removal of the carbon based polymer layer may be followed by a lateral trimming process of fin structures 114.1 and 118.1 to achieve fin widths $W_2$ (discussed above with reference to FIG. 1E) for each of fin structures 114.1 through 114.4 and 118.1 through 118.4.

The lateral trimming process may involve oxidation of a thin surface on sidewalls of fin structures 114.1 and 118.1 followed by a wet etching process using etchant such as, for example, diluted hydrofluoric acid (DHF) to remove the oxidized surface from sidewalls of fin structures 114.1 and 118.1. As material of fin structures 114.1 and 118.1 may be consumed during oxidation of sidewall surfaces of fin structures 114.1 and 118.1, etching of the oxidized sidewall surfaces may laterally trim fin structures 114.1 and 118.1 to achieve fin widths $W_2$.

Figure 5A:
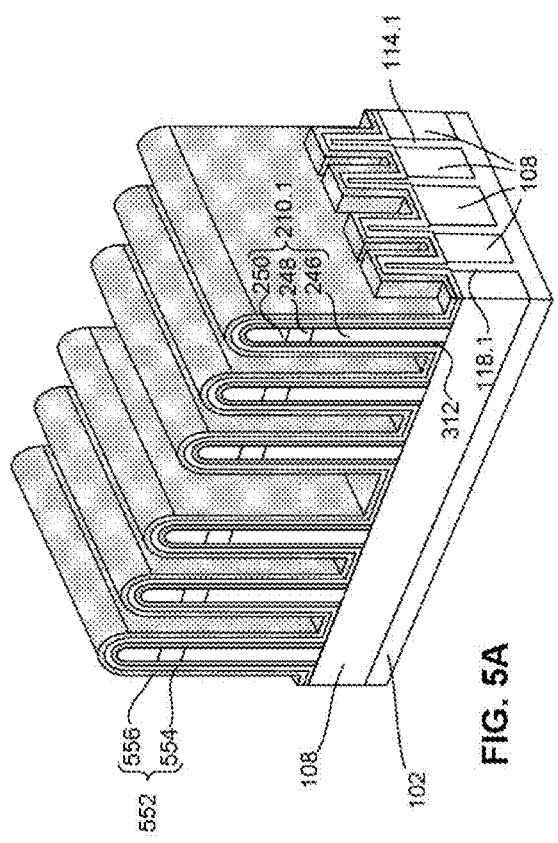
Figure 5C:
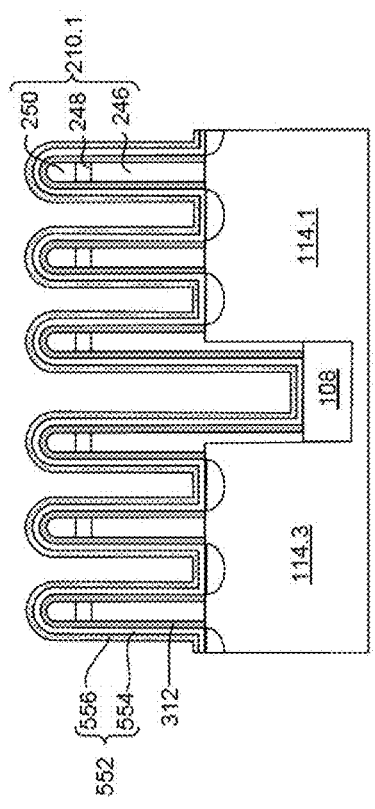
Figure 5B:
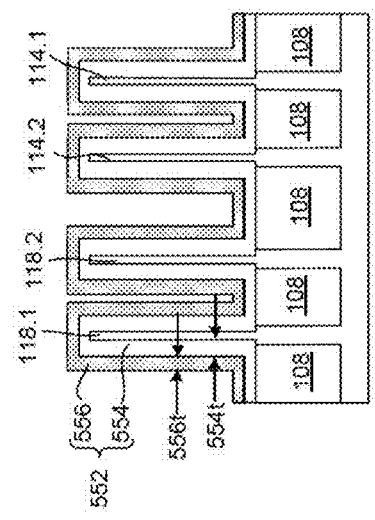

FIGS. 5A-5C are views of a partially fabricated device 100 after formation of hard mask layer 552 on partially fabricated device 100 of FIG. 4A, according to some embodiments. Hard mask layer 552 may include one or more layers of insulating material. In some embodiments, hard mask layer 552 may include first and second hard mask layers 554 and 556, respectively. First hard mask layer 554 may have an oxide material (e.g., silicon oxide) and second hard mask layer 556 may have an oxide material (e.g., Al2O3, HfO2, and/or LaO), a nitride material (e.g., AlON and/or TiN), or a combination thereof. In some embodiments, first and second hard mask layers 554 and 556 may be formed by blanket deposition of their respective materials on partially fabricated device 100 of FIG. 4A and first hard mask layer 554, respectively. In some embodiments, any suitable deposition process such as, for example, CVD or ALD may be used to perform the blanket deposition of first and second hard mask layers 554 and 556. In some embodiments, first and second hard mask layers 554 and 556 may have same or different thicknesses with respect to each other. In some embodiments, first and second hard mask layers 554 and 556 may have thicknesses 554*t* and 556*t* in a range from about 1.5 nm to about 4 nm.

Figure 6A:
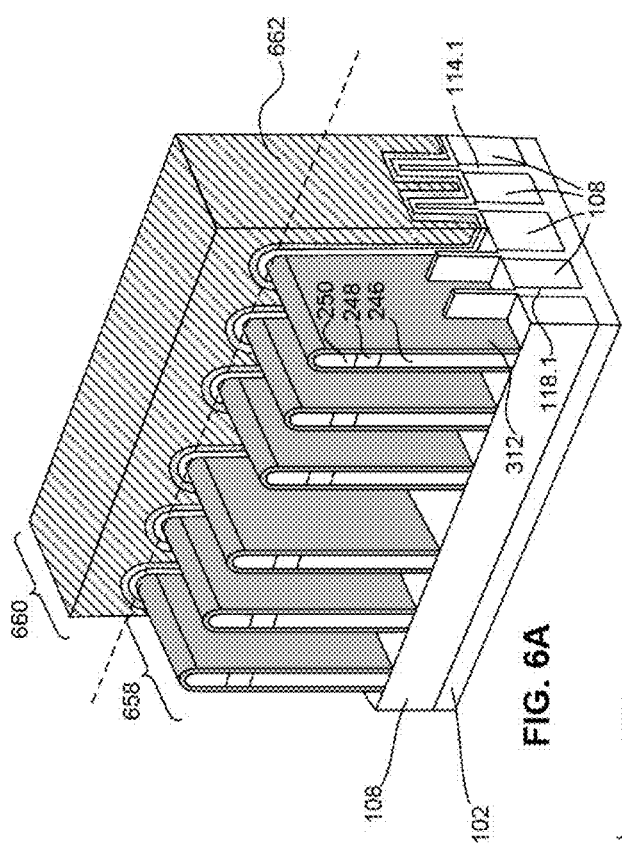
Figure 6C:
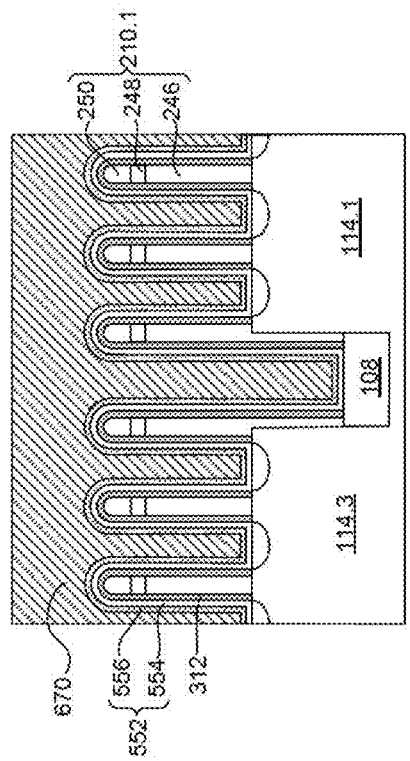
Figure 6B:
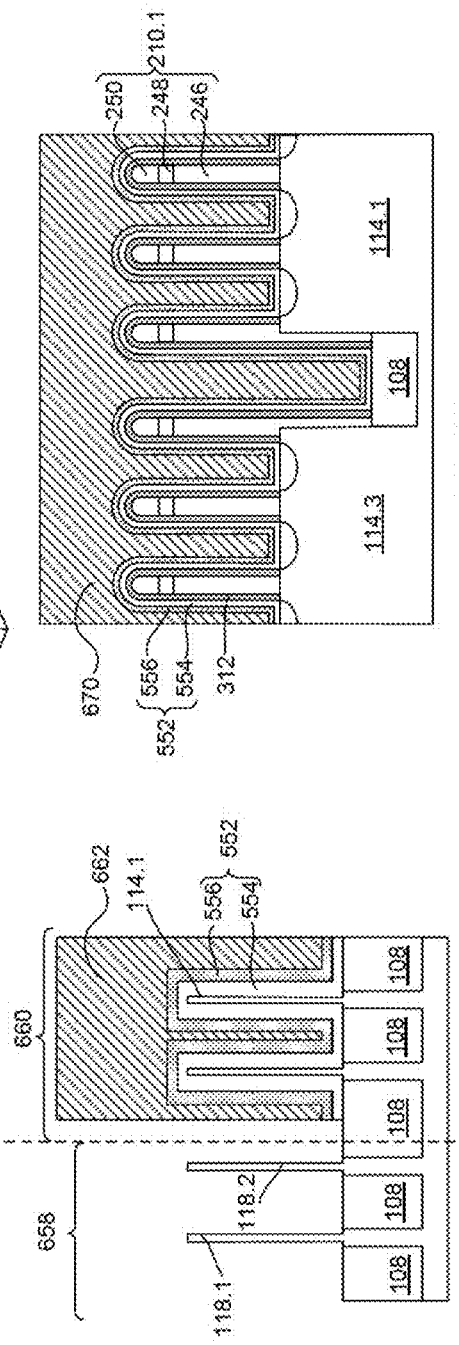

FIGS. 6A-6C are views of a partially fabricated device 100 after removal of hard mask layer 552 from NFET region 658, according to some embodiments. NFET region 658 may be referred herein as region having elements of NFETs 106.1 through 106.4 such as, for example, fin structures 118.1 through 118.4, STI regions 108 adjacent to fin structures 118.1 through 118.4, and/or portions of structures 210.1 through 210.6 wrapped around fin structures 118.1 through 118.4. Removal of hard mask layer 552 from NFET region 658 may involve photolithographic patterning of a photoresist (PR) layer 662 on PFET region 660 and etching of hard mask layer 552 from NFET region 658. PFET region 660 may be referred herein as region having elements of PFETs 104.1 through 104.4, such as, for example, fin structures 114.1 through 114.4, STI regions 108 adjacent to fin structures 114.1 through 114.4, and/or portions of structures 210.1 through 210.6 wrapped around fin structures 114.1 through 114.4.

In some embodiments, second hard mask layer 556 in NFET region 658 may be etched by a dry etching process using an etchant gas such as, for example, CF4. The etchant gas for dry etching of second mask layer 556 may have a selectivity of about 50:1 or greater for second hard mask layer 556 material to first hard mask layer 554 material. First hard mask layer 554 in NFET region 658 can act as an etch stop layer for dry etching of second hard mask layer 556. Also, first hard mask layer 554 can help to minimize damage to fin structures 118.1 through 118.4 during dry etching of second mask layer 556 in NFET region 658. PR layer 662 can help to protect second hard mask layer 556 in PFET region 660 from being etched during dry etching of second hard mask layer 556 in NFET region 658.

In some embodiments, first hard mask layer 554 in NFET region 658 may be etched by a wet etching process using an etchant such as, for example, a solution having (i) NH3 and H2O2, (ii) H2SO4 and H2O2, or (iii) DHF. Etchants for wet etching of first mask layer 554 may have a selectivity of about 50:1 or greater for first hard mask layer 554 material to spacer material layer 312 underlying first hard mask layer 554. Spacer material layer 312 can act as an etch stop layer for wet etching of first hard mask layer 554 in NFET region 658.

In some embodiments, PR layer 662 may be removed by wet etching after removal of first mask layer 554 in NFET region 658. In some embodiments, first hard mask layer 554 in NFET region 658 and PR layer 662 may be removed simultaneously by a wet etching process. Second hard mask layer 556 in PFET region 660 can help to protect its underlying first hard mask layer 554 during wet etching of PR layer 662.

FIGS. 7A-7C are views of a partially fabricated device 100 after formation of n-type epitaxial region 120.1 on fin structure 118.1, according to some embodiments. Prior to formation of n-type epitaxial region 120.1, PR layer 662 in PFET region 660 is removed using a wet etch process. N-type epitaxial region 120.1 may be epitaxially grown on portions of fin structures 118.1 that extends above STI regions 108 and are not underlying structures 210.1 through 210.6, according to some embodiments. Hard mask layer 552 portion in PFET region 660 helps to prevent epitaxial growth on fin structure 114.1 during epitaxial growth of n-type epitaxial region 120.1.

Epitaxial region 120.1 may include the same material as or different from the material of substrate 102. Epitaxial region 120.1 may include (i) a semiconductor material such as germanium or silicon; (ii) a compound semiconductor material, such as gallium arsenide and/or aluminum gallium arsenide; or (iii) a semiconductor alloy, such as silicon germanium and/or gallium arsenide phosphide. In some embodiments, epitaxial region 120.1 may have a thickness $T_1$ in a range from about 5 nm to about 15 nm surrounding portions of fin structure 118.1 that are above STI regions 108.

In some embodiments, epitaxial region 120.1 may be grown by (i) CVD, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial region 120.1 may be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial region 120.1 may be grown by selective epitaxial growth (SEG), where an etching gas is added to promote the selective growth of semiconductor material on the exposed surfaces of fin structure 118.1 but not on insulating material (e.g., dielectric material of STI regions 108).

N-type epitaxial region 120.1 may include Si and may be in-situ doped during its epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used. As discussed above with reference to FIG. 1E, epitaxial region 120.1 may have n-type sub-regions 132, 134, and 136, according to some embodiments.

FIGS. 8A-8C are views of a partially fabricated device 100 after removal of hard mask layer 552 in PFET region 660, according to some embodiments. Hard mask layer 552 in PFET region 600 may be etched in a manner similar to the etching of hard mask layer 552 in NFET region 658, described above with reference to FIGS. 6A-6C.

FIGS. 9A-9C are views of a partially fabricated device 100 after formation of hard mask layer 952 on partially fabricated device 100 of FIG. 8A, according to some embodiments. Hard mask layer 952 may include one or more layers of insulating material. In some embodiments, hard mask layer 952 may include first and second hard mask layers 954 and 956, respectively. First and second hard mask layers 954 and 956 may be similar to first and second hard mask layers 554 and 556, respectively, in structure, composition, and function. In some embodiments, first and second hard mask layers 954 and 956 may be formed by blanket deposition of their respective materials on partially fabricated device 100 of FIG. 8A in a manner similar to deposition of first and second hard mask layers 554 and 556, respectively.

FIGS. 10A-10C are views of a partially fabricated device 100 after removal of hard mask layer 952 in PFET region 660, according to some embodiments. Removal of hard mask layer 952 portion in PFET region 660 may involve photolithographic patterning of a photoresist (PR) layer 1062 on NFET region 658 and etching of hard mask layer 952 from PFET region 660. Hard mask layer 952 in PFET region 600 may be etched in a manner similar to the etching of hard mask layer 552 in NFET region 658, as described above with reference to FIGS. 6A-6C. Similar to PR layer 662 of FIGS. 6A-6C, PR layer 1062 can help to protect second hard mask layer 956 in NFET region 658 from being etched during dry etching of second hard mask layer 956 in PFET region 660.

Figure 11A:
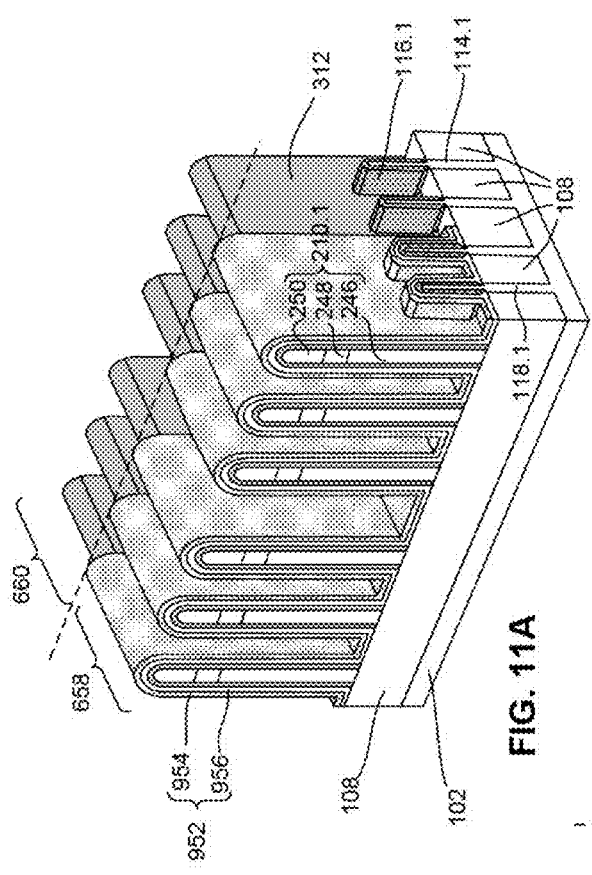
Figure 11B:
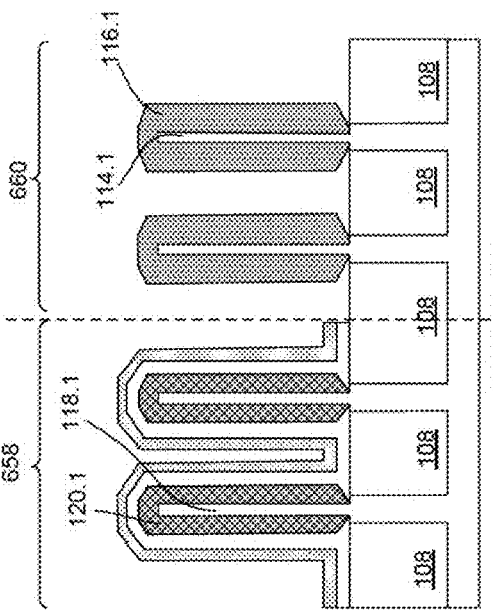
Figure 11C:
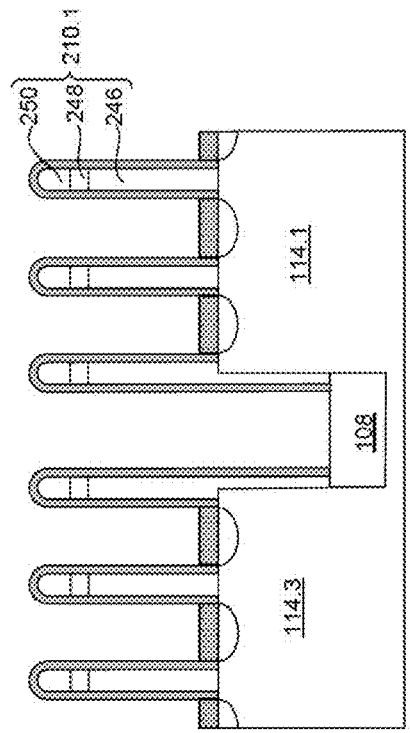

FIGS. 11A-11C are views of a partially fabricated device 100 after formation of p-type epitaxial region 116.1 on fin structure 114.1, according to some embodiments. Prior to formation of p-type epitaxial region 116.1, PR layer 1062 in NFET region 658 is removed using a wet etch process. P-type epitaxial region 116.1 may be epitaxially grown on portions of fin structures 114.1 that extends above STI regions 108 and are not underlying structures 210.1 through 210.6, according to some embodiments. Hard mask layer 952 portion in NFET region 658 helps to prevent epitaxial growth on fin structure 118.1 during epitaxial growth of p-type epitaxial region 116.1.

Epitaxial region 116.1 may include the same material as or different from the material of substrate 102. Epitaxial region 116.1 may include (i) a semiconductor material such as germanium or silicon; (ii) a compound semiconductor material, such as gallium arsenide and/or aluminum gallium arsenide; or (iii) a semiconductor alloy, such as silicon germanium and/or gallium arsenide phosphide. In some embodiments, epitaxial region 116.1 may be grown by (i) CVD, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial region 116.1 may be grown by an epitaxial deposition/partial etch process, which repeats the epitaxial deposition/partial etch process at least once. Such repeated deposition/partial etch process is also called a "cyclic deposition-etch (CDE)" process. In some embodiments, epitaxial region 116.1 may be grown by selective epitaxial growth (SEG), where an etching gas is added to promote the selective growth of semiconductor material on the exposed surfaces of fin structure 114.1 but not on insulating material (e.g., dielectric material of STI regions 108).

P-type epitaxial region 116.1 may include SiGe and may be in-situ doped during its epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. As discussed above with reference to FIG. 1E, epitaxial region 116.1 may have p-type sub-regions 126, 128, and 130, according to some embodiments.

Figure 12A:
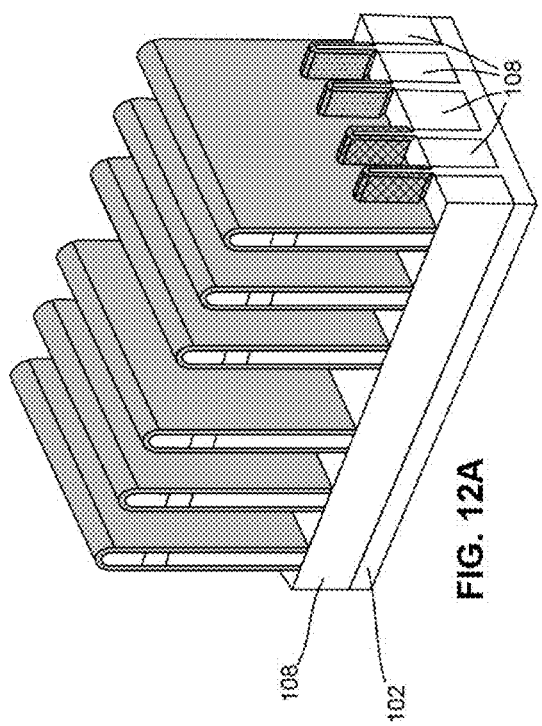
Figure 12C:
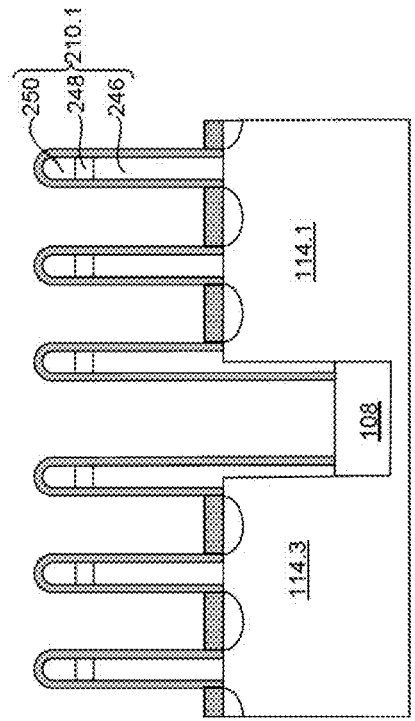
Figure 12B:
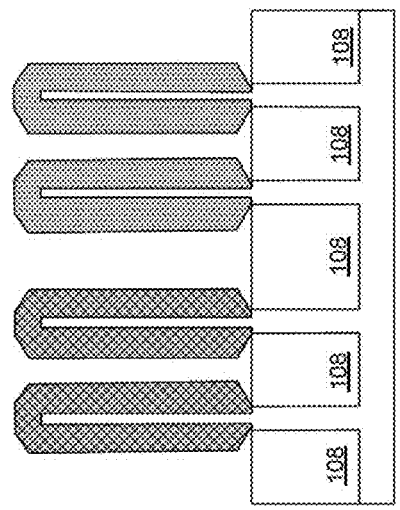

FIGS. 12A-12C are views of a partially fabricated device 100 after removal of hard mask layer 952 in NFET region 658, according to some embodiments. Hard mask layer 952 may be etched in a manner similar to the etching of hard mask layer 552 in NFET region 658, described above with reference to FIGS. 6A-6C.

Formation of the structures of FIGS. 12A-12C may be followed by formation of other elements of device 100 such as gate structures 110.1 through 110.6 using a replacement metal gate process, interlayer dielectric layer, S/D contacts, gate contacts, vias, interconnect metal layers, passivation layers, etc., that are not shown for the sake of simplicity.

The above described example method for fabricating an n-type epitaxial region (e.g., region 120.1) on a fin structure (e.g., 118.1) and a p-type epitaxial region (e.g., region 116.1) on another fin structure (e.g., 114.1) using a dual epitaxial growth process provides a highly selective and conformal growth of the n-type and p-type epitaxial regions on the fin structures. Such dual epitaxial growth is achieved with substantially reduced or minimal damage to structural and functional integrity of the fin structures compared to other methods of forming epitaxial regions on fin structures.

Figure 13:
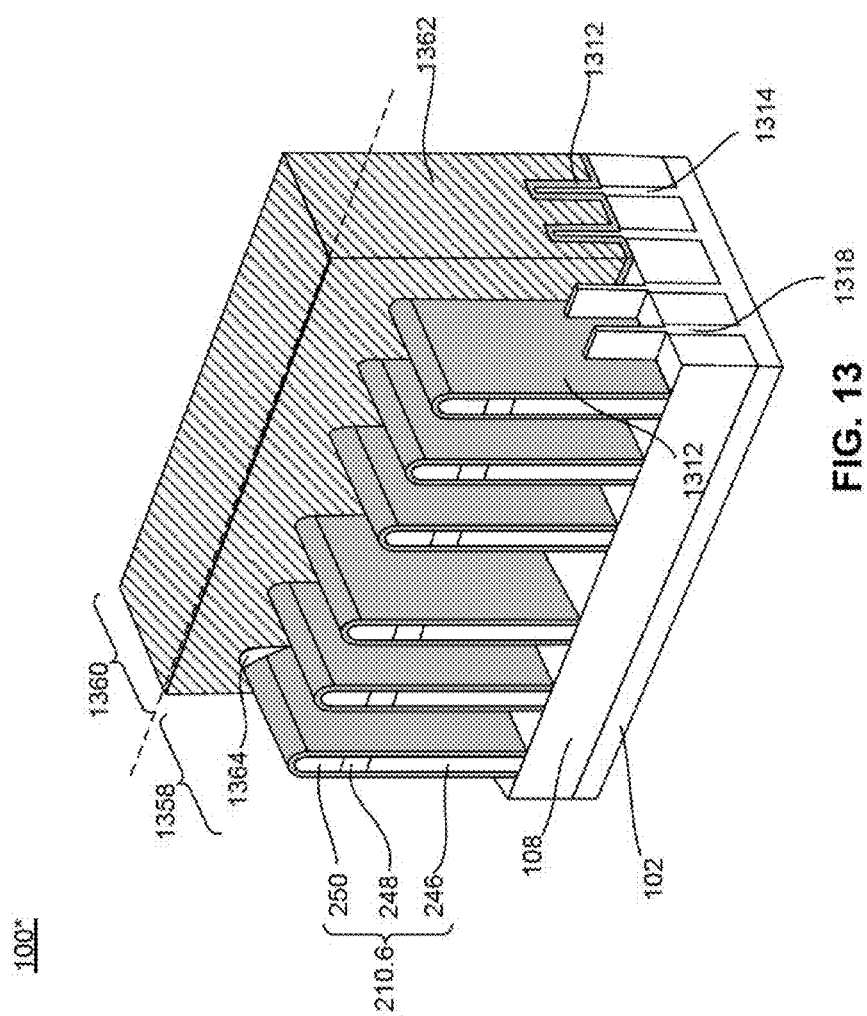
FIG. 13 is an isometric view of an example semiconductor device at a stage of its fabrication process.

Some of the limitations in applying one of the other methods for fabricating n-type and p-type epitaxial regions (not shown) on fin structures using a dual epitaxial growth are discussed below with respect to FIG. 13. FIG. 13 shows a device 100* having NFET and PFET regions 1358 and 1360, respectively. Elements of device 100* with the same annotations as elements of device 100 may be similar in structure and function as device 100. Device 100* is shown after the etching of spacer material layer 1312 from sidewalls and top surface of fin structure 1318 in NFET region 1358. Prior to the etching of spacer material layer 1312 from fin structure 1318, a photoresist (PR) layer 1362 is patterned on structures in PFET region 1360 to prevent the etching of spacer material layer 1312 on fin structure 1314. Spacer material layer 1312 on fin structure 1314 helps to prevent growth of n-type epitaxial region on fin structure 1314 during subsequent growth of n-type epitaxial region on fin structure 1318.

However, the use of a PR layer during the etching of spacer material layer 1312 adversely affects the structural integrity of, for example, fin structures 1314 and 1318, STI regions 108, and/or spacer material layer 1312 on structure 210.6. The material of PR layer 1362 reacts with etchants used in the etching process and reduces the selectivity of etchant to spacer material layer compared to its selectivity to material of fin structure 1318. As a result, there is loss of material of fin structure 1318 during the etching of spacer material layer 1312. The reaction of etchants with the material of PR layer 1362 also causes loss and damage to spacer material layer 1312 on fin structure 1314. As a result, fin structure 1314 is not protected from growth of n-type epitaxial region during subsequent growth of n-type epitaxial region on fin structure 1318. In addition, microtrenches such as micro-trench 1364 shown in FIG. 13 are formed on spacer material layer 1312 due to the reaction of etchants with material of PR layer 1361, and as a result, structures of spacers formed from spacer material layer 1312 in subsequent processing are damaged.

Thus, the absence of a PR layer during the simultaneous etching of spacer material from fin structures in the above described fabrication method for PFETs and NFETs of device 100 helps to overcome some of the limitations in other methods for fabricating PFETs and NFETs.

Example Operations for Fabricating a Device

Figure 14:
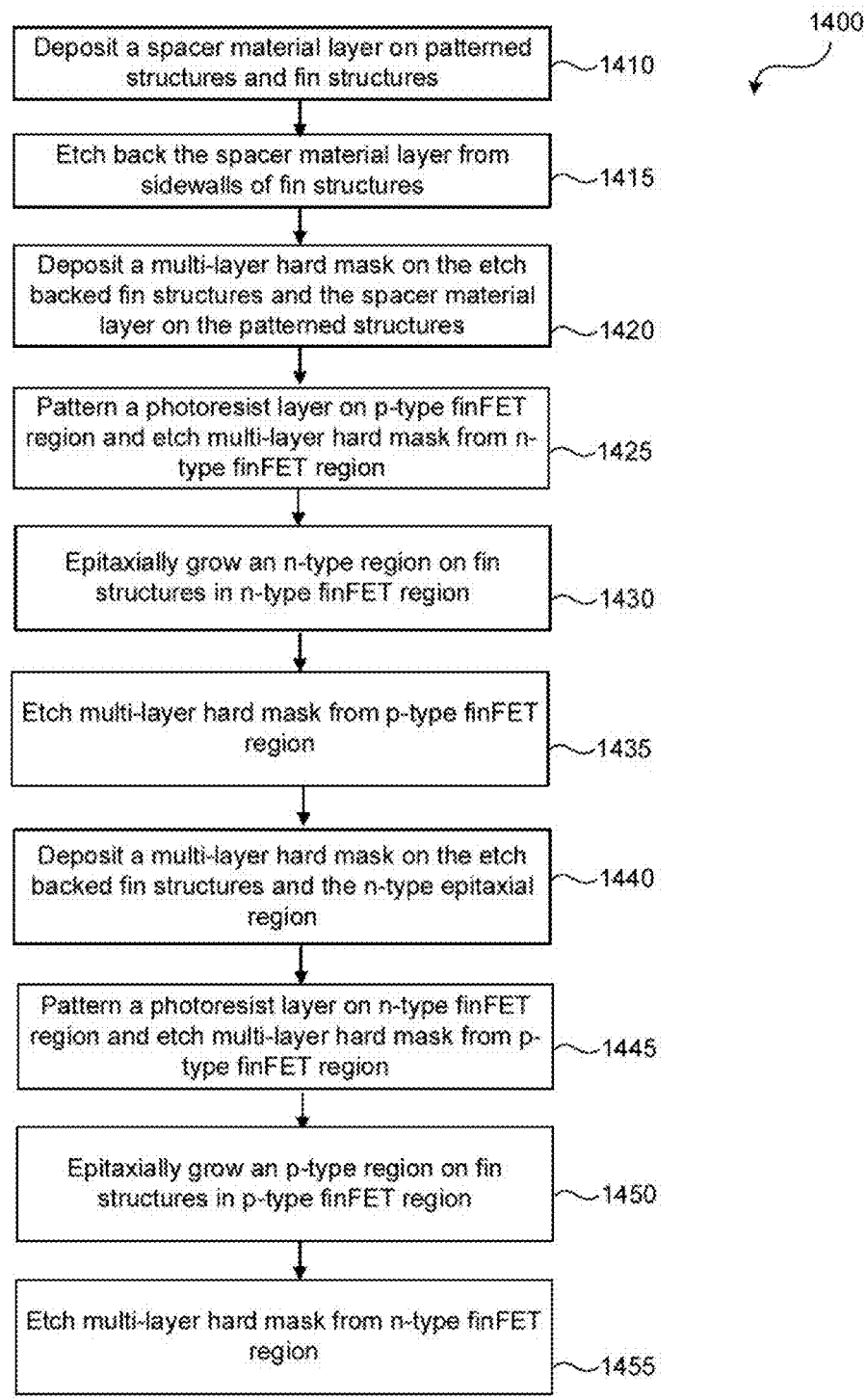
FIG. 14 is flow diagram of a method for fabricating a semiconductor device, in accordance with some embodiments.

FIG. 14 is a flow diagram of an exemplary method 1400 for fabricating device 100. Solely for illustrative purposes, the operations illustrated in FIG. 14 will be described with reference to the example fabrication process illustrated in FIGS. 2A-12A, 2B-12B, and 2C-12C. Operations can be performed in a different order or not performed depending on specific applications. It should be noted that method 1400 does not produce a complete device 100. Accordingly, it is understood that additional processes may be provided before, during, and after method 1400, and that some other processes may only be briefly described herein.

In operation 1410, a spacer material layer is deposited on fin structures and patterned structures. For example, spacer material layer 312 may be blanket deposited on fin structures 114.1 through 114.4 and 118.1 through 118.4 and patterned structures 210.1 through 210.6. Spacer material layer 312 may be deposited in two stages using any suitable deposition process such as, for example, CVD or ALD. In the first stage deposition, a thickness of spacer material layer 312 in a range from about 3 nm to about 5 nm may be deposited. During the second stage deposition, a thickness of spacer material layer 312 in a range from about 4 nm to about 6 nm may be deposited to achieve a final thickness 312$t$ in a range from about 7 nm to about 10 nm.

In operation 1415, the spacer material layer is etched back from a top surface and sidewalls of the fin structures. For example, spacer material layer 312 may be etched back from top surfaces and sidewalls of fin structures 114.1 and 118.1. The etch back of spacer material layer 312 from fin structures 114.1 and 118.1 may be simultaneously performed. In some embodiments, the etch back of spacer layer material 312 may be performed using a dry etching process such as for example, reactive ion etching (RIE) or any other dry etching process using a chlorine or fluorine based etchant. In some embodiments, etch back of spacer layer material 312 may be performed using a cyclic process of deposition and etching. In this cyclic process, one or more cycles of a carbon based polymer deposition may be followed by a dry etching process using a chlorine or fluorine based etchant.

In operation 1420, a multi-layer hard mask is deposited on the etched back fin structures of operation 1415 and spacer material layer on the patterned structures. For example, hard mask layer 552 may be deposited on fin structures 114.1 and 118.1 and spacer material layer 312 on structure 210.1. Hard mask layer 552 may include one or more layers of insulating material. In some embodiments, hard mask layer 552 may include first and second hard mask layers 554 and 556, respectively. First hard mask layer 554 may have an oxide material (e.g., silicon oxide) and second hard mask layer 556 may have an oxide material (e.g., Al2O3, HfO2, and/or LaO), a nitride material (e.g., AlON and/or TiN), or a combination thereof. In some embodiments, any suitable deposition process such as, for example, CVD or ALD may be used to perform the blanket deposition of first and second hard mask layers 554 and 556.

In operation 1425, a photoresist (PR) layer is patterned on a p-type finFET (PFET) region and the multi-layer hard mask in an n-type finFET (NFET) region is etched. For example, a PR layer 662 may be patterned on PFET region 660 and hard mask layer 552 is etched from NFET region 658. Second hard mask layer 556 of hard mask layer 552 may be etched by a dry etching process using etchant gas such as, for example, CF4. Etchant gas for dry etching of second mask layer 556 may have a selectivity of about 50:1 or greater for second hard mask layer 556 material to first hard mask layer 554 material. First hard mask layer 554 of hard mask layer 552 may be etched by a wet etching process using an etchant such as, for example, a solution having (i) NH$_3$ and H$_2$O$_2$, (ii) H$_2$SO$_4$ and H$_2$O$_2$, or (iii) DHF. Etchants for wet etching of first mask layer 554 may have a selectivity of about 50:1 or greater for first hard mask layer 554 material to spacer material layer 312 underlying first hard mask layer 554. Spacer material layer 312 can act as an etch stop layer for wet etching of first hard mask layer 554.

In operation 1430, an n-type epitaxial region is grown on an etched back fin structure in the NFET region. For example, n-type epitaxial region 120.1 may be grown on fin structure 118.1 in NFET region 658. Prior to formation of n-type epitaxial region 120.1, PR layer 662 in PFET region 660 may be removed using a wet etch process. N-type epitaxial region 120.1 may be epitaxially grown on portions of fin structures 118.1 that extends above STI regions 108 and are not underlying structures 210.1 through 210.6. In some embodiments, epitaxial region 120.1 may be grown by (i) CVD, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. N-type epitaxial region 120.1 may include Si and may be in-situ doped during its epitaxial growth process using n-type dopants, such as, for example, phosphorus or arsenic.

In operation 1435, the multi-layer hard mask layer in the PFET region is etched. For example, hard mask layer 552 in PFET region 660 may be etched off in a manner similar to the etching of hard mask layer 552 in NFET region 658 discussed in operation 1425.

In operation 1440, a multi-layer hard mask layer is deposited on an etched back fin structure in the PFET region and on the n-type epitaxial region of operation 1430. For example, a hard mask layer 952 may be deposited on fin structure 114.1 in PFET region 660 and on n-type epitaxial region 120.1. Hard mask layer 952 may include first and second hard mask layers 954 and 956, respectively. First and second hard mask layers 954 and 956 may be similar to first and second hard mask layers 554 and 556 of hard mask layer 552, respectively, in structure, composition, and function.

In operation 1445, a photoresist (PR) layer is patterned on an NFET region and the multi-layer hard mask of operation 1440 in an n-type finFET (NFET) region is etched. For example, a PR layer 1062 may be patterned on NFET region 658 and hard mask layer 952 is etched from PFET region 660. Hard mask layer 952 in PFET region 600 may be etched in a manner similar to the etching of hard mask layer 552 in NFET region 658 discussed in operation 1425.

In operation 1450, a p-type epitaxial region is grown on an etched back fin structure in the PFET region. For example, p-type epitaxial region 116.1 may be grown on fin structure 114.1 in PFET region 660. Prior to formation of p-type epitaxial region 116.1, PR layer 1062 in NFET region 658 may be removed using a wet etch process. P-type epitaxial region 116.1 may be epitaxially grown on portions of fin structures 114.1 that extends above STI regions 108 and are not underlying structures 210.1 through 210.6 In some embodiments, epitaxial region 116.1 may be grown by (i) CVD, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. P-type epitaxial region 116.1 may include SiGe and may be in-situ doped during its epitaxial growth process using p-type dopants, such as, for example, boron, indium, or gallium.

In operation 1455, the multi-layer hard mask layer in the NFET region is etched. For example, hard mask layer 952 in NFET region 658 may be etched off in a manner similar to the etching of hard mask layer 552 in NFET region 658 discussed in operation 1425.

Example Embodiments and Benefits

The above embodiments describe fabricating an n-type epitaxial region (e.g., region 120.1) on a fin structure (e.g., 118.1) and a p-type epitaxial region (e.g., region 116.1) on another fin structure (e.g., 114.1) using a dual epitaxial growth process. Such embodiments provide a highly selective and conformal growth of the n-type and p-type epitaxial regions on the fin structures. The dual epitaxial growth is achieved with substantially reduced or minimal damage to structural and functional integrity of the fin structures. Some of the embodiments are described below.

A method of forming a semiconductor device includes forming first and second fin structures on a substrate and a patterned polysilicon structure on first portions of the first and second fin structures. The method further includes depositing an insulating layer on second portions of the first and second fin structures and on the patterned polysilicon structure, which may be followed by selectively removing the insulating layer from the second portions of the first and second fin structures and patterning a first hard mask layer on the second portion of the second fin structure. The method also includes growing a first epitaxial region with a first type conductivity on the second portion of the first fin structure, removing the patterned first hard mask layer from the second portion of the second fin structure, patterning a second hard mask layer on the first epitaxial region, and growing a second epitaxial region with a second type conductivity on the second portion of the second fin structure. The second type conductivity may be different from the first type conductivity.

A method of forming a semiconductor device includes forming first and second fin structures on a substrate and a patterned polysilicon structure on first portions of the first and second fin structures. The method further includes depositing an insulating layer on second portions of the first and second fin structures and on the patterned polysilicon structure, which may be followed by etching the insulating layer from the second portions of the first and second fin structures, laterally trimming the etched second portions of the first and second fin structures, and patterning a first hard mask layer on the trimmed second portion of the second fin structure. The method also includes growing a first epitaxial region with a first type conductivity on the trimmed second portion of the first fin structure, patterning a second hard mask layer on the first epitaxial region, and growing a second epitaxial region with a second type conductivity on the trimmed second portion of the second fin structure. The second type conductivity may be different from the first type conductivity.

A method of forming a semiconductor device includes forming first and second fin structures on a substrate and depositing an insulating layer on the first and second fin structures. The method further includes etching the insulating layer from the first and second fin structures and patterning a first hard mask layer on the second fin structure. The method also includes growing a first epitaxial region with a first type conductivity on the first fin structure, removing the patterned first hard mask layer from the second fin structure, patterning a second hard mask layer on the first epitaxial region, and growing a second epitaxial region with a second type conductivity on the second fin structure. The second type conductivity may be different from the first type conductivity.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising:
    forming first and second fin structures on a substrate;
    forming a patterned polysilicon structure on first portions of the first and second fin structures;
    depositing an insulating layer on second portions of the first and second fin structures and on the patterned polysilicon structure;
    selectively removing the insulating layer from the second portions of the first and second fin structures;
    patterning a first hard mask layer on the second portion of the second fin structure;
    growing a first epitaxial region with a first type conductivity on the second portion of the first fin structure;
    removing the patterned first hard mask layer from the second portion of the second fin structure;
    patterning a second hard mask layer on the first epitaxial region; and
    growing a second epitaxial region with a second type conductivity on the second portion of the second fin structure, the second type conductivity being different from the first type conductivity.

2. The method of claim 1, wherein the selectively removing the insulating layer comprises:
    depositing a polymer layer on the patterned polysilicon structure; and
    etching the insulating layer from the second portions of the first and second fin structures.

3. The method of claim 1, wherein the patterning the first hard mask layer comprises:
    depositing the first hard mask layer on the second portions of the first and second fin structures;
    patterning a photoresist layer over the second portion of the second fin structure; and
    etching the first hard mask layer from the second portion of the first fin structure.

4. The method of claim 1, wherein the patterning the first hard mask layer comprises:
    depositing a first insulating layer, having a first material, on the second portions of the first and second fin structures;
    depositing a second insulating layer, having a second material, on the first insulating layer, the second material being different from the first material;
    patterning a photoresist layer over the second portion of the second fin structure; and
    etching the first and second insulating layers from the second portion of the first fin structure.

5. The method of claim 1, wherein the growing the first epitaxial region comprises:

epitaxially growing a semiconductor material on the second portion of the first fin structure; and in-situ doping of the semiconductor material with dopants having the first type conductivity.

6. The method of claim 1, wherein the removing the patterned first hard mask layer comprises:
dry etching a first layer of the first hard mask layer; and
wet etching a second layer of the first hard mask layer.

7. The method of claim 1, wherein the growing the second epitaxial region comprises:
epitaxially growing a semiconductor material on the second portion of the second fin structure; and
in-situ doping of the semiconductor material with dopants having the second type conductivity.

8. The method of claim 1, wherein the growing the first epitaxial region comprises:
epitaxially growing a first region, having a first dopant concentration, on the second portion of the first fin structure;
epitaxially growing a second region, having a second dopant concentration, on the first region; and
epitaxially growing a third region, having a third dopant concentration, on the second region, wherein the first, second, and third dopant concentrations are different from each other.

9. The method of claim 1, wherein the growing the second epitaxial region comprises:
epitaxially growing a first region, having a first germanium (Ge) atomic concentration, on the second portion of the second fin structure;
epitaxially growing a second region, having a second Ge atomic concentration, on the first region; and
epitaxially growing a third region, having a third Ge atomic concentration, on the second region, wherein the first, second, and third Ge atomic concentrations are different from each other.

10. The method of claim 1, wherein the insulating layer comprises a low-k material.

11. The method of claim 1, further comprising:
laterally trimming the second portions of the first and second fin structures after the selectively removing the insulating layer.

12. A method of forming a semiconductor device comprising:
forming first and second fin structures on a substrate;
forming a patterned polysilicon structure on first portions of the first and second fin structures;
depositing an insulating layer on second portions of the first and second fin structures and on the patterned polysilicon structure;
etching the insulating layer from the second portions of the first and second fin structures;
laterally trimming the etched second portions of the first and second fin structures;
patterning a first hard mask layer on the trimmed second portion of the second fin structure;
growing a first epitaxial region with a first type conductivity on the trimmed second portion of the first fin structure;
patterning a second hard mask layer on the first epitaxial region; and
growing a second epitaxial region with a second type conductivity on the trimmed second portion of the second fin structure, the second type conductivity being different from the first type conductivity.

13. The method of claim 12, wherein the laterally trimming comprises oxidizing surfaces of sidewalls of the second portions of the first and second fin structures.

14. The method of claim 12, wherein the patterning the first hard mask layer comprises:
depositing a first insulating layer, having a first material, on the trimmed second portions of the first and second fin structures;
depositing a second insulating layer, having a second material, on the first insulating layer, the second material being different from the first material;
patterning a photoresist layer over the trimmed second portion of the second fin structure; and
etching the first and second insulating layers from the trimmed second portion of the first fin structure.

15. The method of claim 12, further comprising:
removing the patterned first hard mask layer from the trimmed second portion of the second fin structure prior to the patterning of the second hard mask layer on the first epitaxial region.

16. The method of claim 15, wherein the removing the patterned first hard mask layer from the trimmed second portion of the second fin structure comprises:
dry etching a first layer of the first hard mask layer; and
wet etching a second layer of the first hard mask layer.

17. A method of forming a semiconductor device comprising:
forming first and second fin structures on a substrate;
depositing an insulating layer on the first and second fin structures;
etching the insulating layer from the first and second fin structures;
patterning a first hard mask layer on the second fin structure;
growing a first epitaxial region with a first type conductivity on the first fin structure;
removing the patterned first hard mask layer from the second fin structure;
patterning a second hard mask layer on the first epitaxial region; and
growing a second epitaxial region with a second type conductivity on the second fin structure, the second type conductivity being different from the first type conductivity.

18. The method of claim 17, wherein the growing of the first epitaxial region comprises:
epitaxially growing a first region, having a first dopant concentration, on the first fin structure;
epitaxially growing a second region, having a second dopant concentration, on the first region; and
epitaxially growing a third region, having a third dopant concentration, on the second region, wherein the first, second, and third dopant concentrations are different from each other.

19. The method of claim 17, wherein the growing of the second epitaxial region comprises:
epitaxially growing a first region, having a first germanium (Ge) atomic concentration, on the second fin structure;
epitaxially growing a second region, having a second Ge atomic concentration, on the first region; and
epitaxially growing a third region, having a third Ge atomic concentration, on the second region, wherein the first, second, and third Ge atomic concentrations are different from each other.

20. The method of claim 17, further comprising:
laterally trimming the first and second fin structures after the etching the insulating layer.

\* \* \* \* \*

UNITED STATES PATENT AND TRADEMARK OFFICE
CERTIFICATE OF CORRECTION

PATENT NO. : 10,002,796 B1  
APPLICATION NO. : 15/476068  
DATED : June 19, 2018  
INVENTOR(S) : Su et al.

Page 1 of 1

It is certified that error appears in the above-identified patent and that said Letters Patent is hereby corrected as shown below:

On the Title Page

Column 1, Item (*), in "Notice", Line 3, delete "days. days." and insert -- days. --, therefor.

In the Specification

In Column 7, Line 42, delete "(TiA1)," and insert -- (TiAl), --, therefor.

In Column 7, Lines 66-67, delete "LDD regions 142 of.................106.1 and" and insert the same at Line 65 after "discussion, p-type".

In Column 10, Line 21, delete "(ME)" and insert -- (RIE) --, therefor.

Signed and Sealed this  
Twenty-eighth Day of May, 2019

Andrei Iancu  
*Director of the United States Patent and Trademark Office*